United States Patent
Kim et al.

(10) Patent No.: US 11,723,202 B2
(45) Date of Patent: Aug. 8, 2023

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Ga Eun Kim, Yongin-si (KR); Yoon Hwan Son, Seoul (KR); Sung Won Cho, Seoul (KR); Joo Hee Park, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 312 days.

(21) Appl. No.: 17/034,420

(22) Filed: Sep. 28, 2020

(65) Prior Publication Data

US 2021/0288068 A1    Sep. 16, 2021

(30) Foreign Application Priority Data

Mar. 13, 2020    (KR) .................... 10-2020-0031419

(51) Int. Cl.
*H10B 43/27*    (2023.01)
*H10B 43/40*    (2023.01)
*H10B 43/50*    (2023.01)
*H10B 43/10*    (2023.01)

(52) U.S. Cl.
CPC ............ *H10B 43/27* (2023.02); *H10B 43/10* (2023.02); *H10B 43/40* (2023.02); *H10B 43/50* (2023.02)

(58) Field of Classification Search
CPC ......... H01L 27/11573; H01L 27/11575; H01L 27/11582; H10B 43/10; H10B 43/27; H10B 43/40; H10B 43/50
See application file for complete search history.

(56) References Cited

U.S. PATENT DOCUMENTS

| | | | |
|---|---|---|---|
| 8,791,523 B2 | 7/2014 | Iino et al. | |
| 9,741,733 B2 | 8/2017 | Lim et al. | |
| 9,847,341 B2 | 12/2017 | Shin et al. | |
| 9,887,208 B2 | 2/2018 | Son et al. | |
| 2016/0163732 A1* | 6/2016 | Lim .................. | H01L 27/11573 257/314 |

(Continued)

FOREIGN PATENT DOCUMENTS

KR    1615773 B1    7/2009

*Primary Examiner* — Robert G Bachner
*Assistant Examiner* — Molly K Reida
(74) *Attorney, Agent, or Firm* — Fish & Richardson P.C.

(57) ABSTRACT

A semiconductor memory device and a method for fabricating a semiconductor memory device, the device including a peripheral logic structure on a substrate; a horizontal conductive substrate on the peripheral logic structure; a stacked structure including a plurality of electrode pads stacked in a vertical direction; a plate contact plug connected to the horizontal conductive substrate; and a first penetration electrode connected to the lower connection wiring body, wherein upper surfaces of the plate contact plug and the first penetration electrode are on a same plane, the plate contact plug includes an upper part and a lower part directly connected to each other, the first penetration electrode includes an upper part and a lower part directly connected to each other, moving away from upper surfaces of the first penetration electrode and the plate contact plug, widths of the upper parts increase and widths of the lower parts decrease.

20 Claims, 20 Drawing Sheets

(56) References Cited

U.S. PATENT DOCUMENTS

2019/0067308 A1   2/2019  Yun et al.
2019/0172838 A1   6/2019  Jo et al.
2020/0075618 A1*  3/2020  Oike ................. H01L 27/11565

* cited by examiner

SEMICONDUCTOR MEMORY DEVICE AND METHOD OF FABRICATING THE SAME

CROSS-REFERENCE TO RELATED APPLICATION

Korean Patent Application No. 10-2020-0031419, filed on Mar. 13, 2020, in the Korean Intellectual Property Office, and entitled: "Semiconductor Memory Device and Method of Fabricating the Same.

BACKGROUND

1. Field

Embodiments relate to a semiconductor memory device and a method of fabricating the same.

2. Description of the Related Art

In order to achieve excellent performance and low price for consumers, the degree of integration of a semiconductor device may be increased. In the case of the semiconductor device, the degree of integration may be an important factor that determines the price of a product, and thus increasing a degree of integration may be particularly desirable. In the case of a two-dimensional or planar semiconductor device, the degree of integration may be mainly determined by an area occupied by a unit memory cell, and it may be greatly affected by the level of fine pattern forming technology.

SUMMARY

The embodiments may be realized by providing a semiconductor memory device including a peripheral logic structure including a peripheral circuit and a lower connection wiring body on a substrate; a horizontal conductive substrate on the peripheral logic structure; a stacked structure including a plurality of electrode pads stacked in a vertical direction on the horizontal conductive substrate; a plate contact plug connected to the horizontal conductive substrate and extending in the vertical direction; and a first penetration electrode connected to the lower connection wiring body and extending in the vertical direction, wherein an upper surface of the plate contact plug and an upper surface of the first penetration electrode are on a same plane, the plate contact plug includes an upper part and a lower part directly connected to each other, the first penetration electrode includes an upper part and a lower part directly connected to each other, moving away from the upper surface of the first penetration electrode in the vertical direction, a width of the upper part of the first penetration electrode increases, as measured in a horizontal direction orthogonal to the vertical direction, moving away from the upper surface of the plate contact plug in the vertical direction, a width of the upper part of the plate contact plug increases, as measured in the horizontal direction, moving away from the upper surface of the plate contact plug in the vertical direction, a width of the lower part of the plate contact plug decreases, as measured in the horizontal direction, and moving away from the upper surface of the first penetration electrode, a width of the lower part of the first penetration electrode decreases, as measured in the horizontal direction.

The embodiments may be realized by providing a semiconductor memory device including a peripheral logic structure including a peripheral circuit and a lower connection wiring body on a substrate; a horizontal conductive substrate on the peripheral logic structure; a stacked structure including a plurality of electrode pads stacked in a vertical direction on the horizontal conductive substrate; a first plate contact plug connected to the horizontal conductive substrate and extending in the vertical direction; a first penetration electrode connected to the lower connection wiring body and extending in the vertical direction; and a second penetration electrode penetrating the stacked structure and connected to the lower connection wiring body, wherein the first penetration electrode and the first plate contact plug do not penetrate the stacked structure, an upper surface of the first plate contact plug, an upper surface of the first penetration electrode, and an upper surface of the second penetration electrode are on a same plane, a plane at which the first penetration electrode has a maximum width is higher than a plane at which the second penetration electrode has a maximum width, relative to the upper surface of the horizontal conductive substrate in the vertical direction, and the plane at which the first penetration electrode has a maximum width is at a same vertical level as the plane at which the first plate contact plug has a maximum width, relative to the upper surface of the horizontal conductive substrate in the vertical direction.

The embodiments may be realized by providing a semiconductor memory device including a peripheral logic structure including a peripheral circuit and a lower connection wiring body on a substrate; a horizontal conductive substrate extending along an upper surface of the peripheral logic structure; a stacked structure including a plurality of electrode pads stacked in a vertical direction on the horizontal conductive substrate; a plurality of vertical structures penetrating the stacked structure and electrically connected to the horizontal conductive substrate; a vertical structure support film between the stacked structure and the horizontal conductive substrate and being in contact with the vertical structures; a plurality of electrode plugs connected to the plurality of electrode pads; a plate contact plug connected to the horizontal conductive substrate and extending in the vertical direction; and a first penetration electrode connected to the lower connection wiring body and extending in the vertical direction, wherein an upper surface of the plate contact plug and an upper surface of the first penetration electrode are on a same plane, a height in the vertical direction from a plane at which the plate contact plug has a maximum width to the upper surface of the plate contact plug is a first height, a height in the vertical direction from a plane at which the first penetration electrode has a maximum width to the upper surface of the first penetration electrode is a second height, a height in the vertical direction of the first penetration electrode is H, the first height and the second height are each greater than 0, and a difference between the first height and the second height is greater than or equal to 0, and is smaller than or equal to 0.0015*H.

The embodiments may be realized by providing a semiconductor memory device including a peripheral logic structure including a peripheral circuit and a lower connection wiring body on a substrate; a horizontal conductive substrate extending along an upper surface of the peripheral logic structure; a metallic plate film extending along a lower surface of the horizontal conductive substrate, the metallic plate film being between the lower connection wiring body and the horizontal conductive substrate; a stacked structure including a plurality of electrode pads stacked in a vertical direction on the horizontal conductive substrate; a plate contact plug connected to the horizontal conductive substrate and extending in the vertical direction; and a penetration electrode connected to the lower connection wiring body and extending in the vertical direction, wherein an upper surface of the plate contact plug and an upper surface of the penetration electrode are on a same plane.

The embodiments may be realized by providing a method of fabricating a semiconductor memory device, the method including forming a horizontal conductive substrate on a peripheral logic structure that includes a peripheral circuit and a lower connection wiring body; forming a stacked structure including a plurality of stacked electrode pads, and an interlayer insulation film covering the stacked structure, on the horizontal conductive substrate; forming an electrode plug hole for exposing the plurality of electrode pads, in the interlayer insulation film; forming an insulating liner film along an upper surface of the interlayer insulation film and a profile of the electrode plug hole; simultaneously forming a plate contact hole and a penetration electrode hole in the insulating liner film and the interlayer insulation film such that the plate contact hole exposes the horizontal conductive substrate and the penetration electrode hole exposes the lower connection wiring body; and forming an electrode plug, a plate contact plug, and a penetration electrode that fill the electrode plug hole, the plate contact hole, and the penetration electrode hole, wherein a plane at which the penetration electrode hole has a maximum width is at a same vertical level as a plane at which the plate contact hole has a maximum width, relative to an upper surface of the horizontal conductive substrate in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
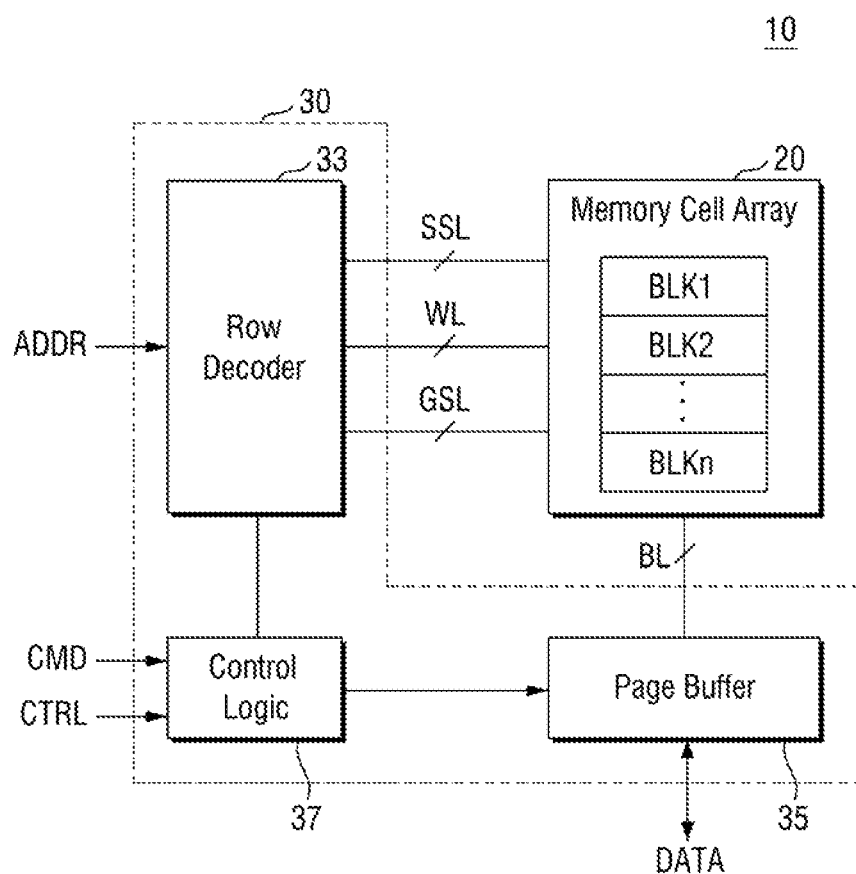
FIG. 1 is a block diagram of a semiconductor memory device according to some embodiments.

FIG. 1 is a block diagram of a semiconductor memory device according to some embodiments.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through bit lines BL, word lines WL, at least one string selection line SSL and at least one ground selection line GSL.

In an implementation, the memory cell blocks BLK1 to BLKn may be connected to a row decoder 33 through the word lines WL, at least one string selection line SSL and at least one ground selection line GSL. Further, the memory cell blocks BLK1 and BLKn may be connected to the page buffer 35 through the bit lines BL.

The peripheral circuit 30 may receive an address ADDR, a command CMD and a control signal CTRL from the outside of the semiconductor memory device 10, and may transmit and receive data DATA to and from an external device of the semiconductor memory device 10. The peripheral circuit 30 may include control logic 37, a row decoder 33 and a page buffer 35.

In an implementation, the peripheral circuit 30 may further include various sub-circuits such as an input/output circuit, a voltage generation circuit that generates various voltages for the operation of the semiconductor memory device 10, and an error correction circuit for correcting error of the data DATA that is read from the memory cell array 20.

The control logic 37 may be connected to the row decoder 33, the voltage generator, and the input/output circuit. The control logic 37 may control the overall operation of the semiconductor memory device 10. The control logic 37 may generate various internal control signals used in the semiconductor memory device 10 in response to the control signal CTRL.

In an implementation, the control logic 37 may adjust voltage levels provided to the word lines WL and the bit lines BL when performing a memory operation such as a program operation or an erase operation.

The row decoder 33 may select at least one of the plurality of memory cell blocks BLK1 to BLKn in response to the address ADDR, and may select at least one word line W, at least one string selection line SSL and at least one ground selection line GSL of the selected memory cell blocks BLK1 to BLKn. The row decoder 33 may transfer a voltage for performing a memory operation to the word line WL of the selected memory cell block BLK1 to BLKn.

The page buffer 35 may be connected to the memory cell array 20 through the bit lines BL. The page buffer 35 may operate as a writer driver or a sense amplifier. In an implementation, at the time of the program operation, the page buffer 35 operates as a write driver and may apply a voltage according to the data DATA to be stored in the memory cell array 20 to the bit lines BL. In an implementation, at the time of the read operation, the page buffer 35 operates as a sense amplifier and may sense data DATA stored in the memory cell array 20.

Figure 2:
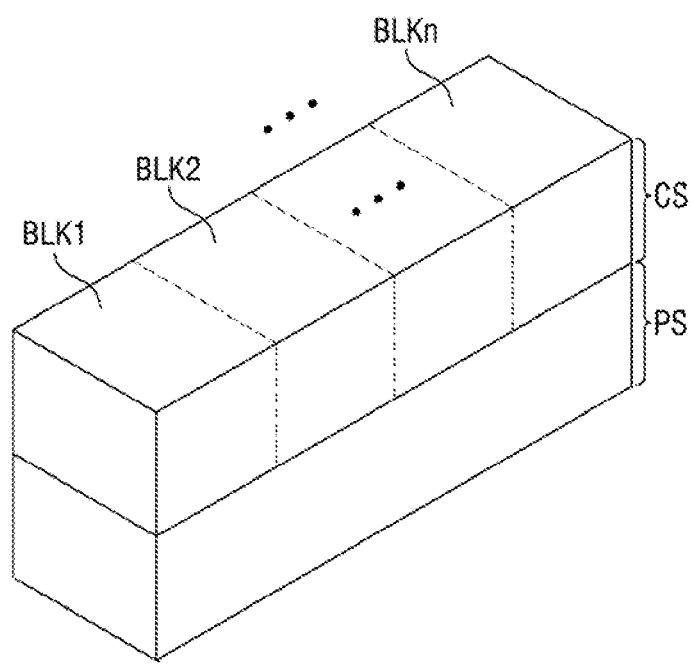
FIG. 2 is a perspective view of an outline of the semiconductor memory device according to some embodiments.

FIG. 2 is a perspective view of an outline of a semiconductor memory device according to some embodiments.

Referring to FIG. 2, the semiconductor memory device according to some embodiments may include a peripheral logic structure PS and a cell array structure CS.

The cell array structure CS may be stacked on the peripheral logic structure PS.

In an implementation, the peripheral logic structure PS and the cell array structure CS may overlap each other from a planar viewpoint. The semiconductor memory device according to some embodiments may have a COP (Cell Over Peri) structure.

In an implementation, the cell array structure CS may include the memory cell array 20 of FIG. 1. The peripheral logic structure PS may include the peripheral circuit 30 of FIG. 1.

The cell array structure CS may include a plurality of memory cell blocks BLK1 to BLKn disposed on the peripheral logic structure PS.

Figure 3:
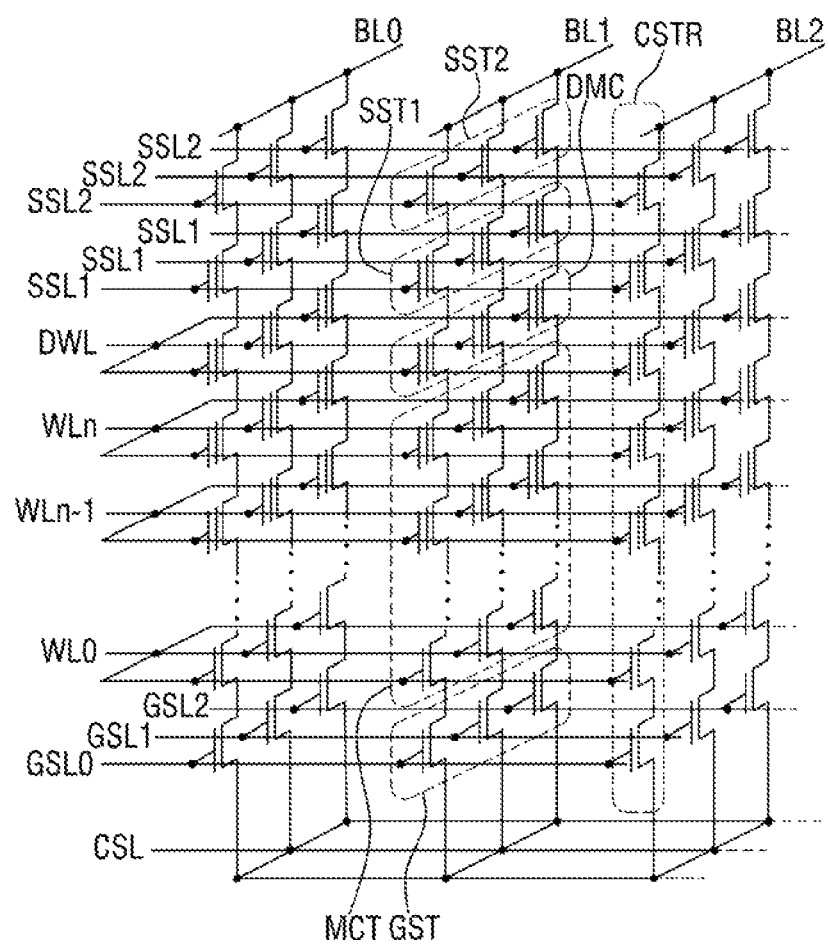
FIG. 3 is a circuit diagram of one memory cell block of a plurality of memory cell blocks included in the semiconductor memory device according to some embodiments.

FIG. 3 is a circuit diagram of one memory cell block of a plurality of memory cell blocks included in the semiconductor memory device according to some embodiments.

Referring to FIG. 3, the memory cell block according to some embodiments may include a common source line CSL, a plurality of bit lines BL, and a plurality of cell strings CSTR disposed between the common source line CSL and the bit lines BL.

A plurality of cell strings CSTR may be connected in parallel to each of the bit lines BL0 to BL2. The plurality of cell strings CSTR may be commonly connected to the common source line CSL. That is, the plurality of cell strings CSTR may be disposed between the plurality of bit lines BL0 to BL2 and the single common source line CSL. A plurality of common source lines CSL may be disposed two-dimensionally. Here, the same voltage may be electrically applied to the common source line CSL or each of the common source lines CSL may be electrically controlled.

In an implementation, each of the cell strings CSTR may include serially connected string selection transistors SST1 and SST2, serially connected memory cells MCT, and a ground selection transistor GST. In an implementation, each of the memory cells MCT includes a data storage element.

In an implementation, each cell string CSTR may include serially connected first and second string selection transistors SST1 and SST2, the second string selection transistor SST2 may be connected to the bit lines BL0 to BL2, and the ground selection transistor GST may be connected to the common source line CSL. The memory cells MCT may be connected in series between the first string selection transistor SST1 and the ground selection transistor GST.

In addition, each of the cell strings CSTR may further include a dummy cell DMC connected between the first string selection transistor SST1 and the memory cell MCT. In an implementation, the dummy cell DMC may also be connected between the ground selection transistor GST and the memory cell MCT. In an implementation, in each cell string CSTR, the ground selection transistor GST may include a plurality of serially connected MOS transistors, similarly to the first and second string selection transistors SST1 and SST2. In an implementation, each cell string CSTR may include a single string selection transistor.

In an implementation, the first string selection transistor SST1 may be controlled by the first string selection line SSL1, and the second string selection transistor SST2 may be controlled by the second string selection line SSL2. The memory cells MCT may be controlled by a plurality of word lines WL0 to WLn, and the dummy cells DMC may be controlled by a dummy word line DWL. Also, the ground selection transistor GST may be controlled by the ground selection line GSL. The common source line CSL may be commonly connected to the sources of the ground selection transistors GST.

The single cell string CSTR may include a plurality of memory cells MCT having different distances from the common source line CSL. Further, a plurality of word lines WL0 to WLn and DWL may be disposed between the common source lines CSL and the bit lines BL0 to BL2.

The gate electrodes of the memory cells MCT, which are at substantially the same distance from the common source line CSL, are commonly connected to one of the word lines WL0 to WLn and DWL and may be in an equipotential state. Unlike this, even if the gate electrodes of the memory cells MCT are at substantially the same level from the common source lines CSL, the gate electrodes disposed in different rows or columns may be controlled independently.

The ground selection lines GSL0 to GSL2 and the string selection lines SSL1 and SSL2 may extend, for example, in the same direction as the word lines WL0 to WLn and DWL. The ground selection lines GSL0 to GSL2 and the string selection lines SSL1 and SSL2 at substantially the same level from the common source line CSL may be electrically separated from each other.

Figure 4:
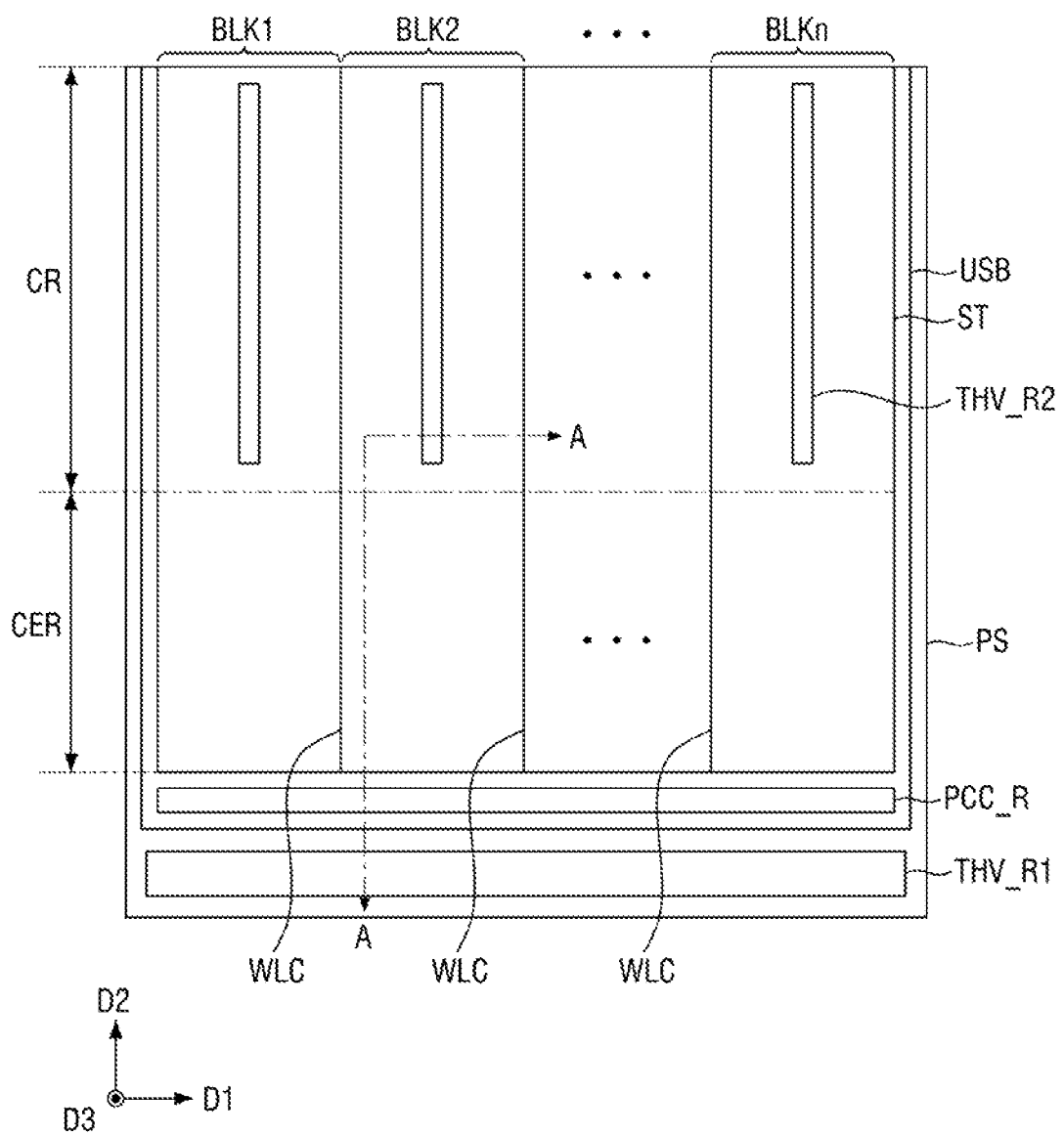
FIG. 4 is a layout diagram of the semiconductor memory device according to some embodiments.
Figure 5:
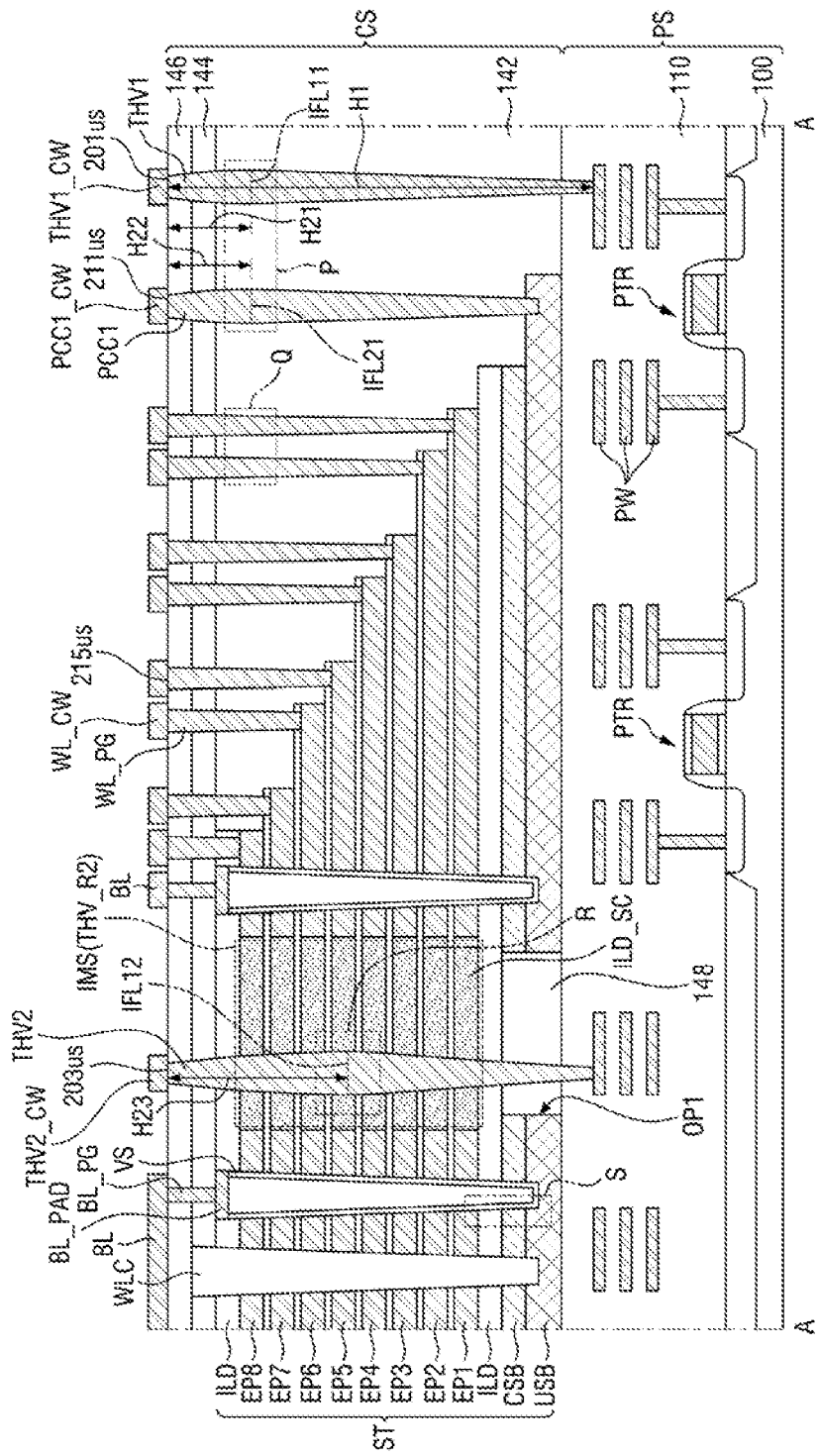
FIG. 5 is a cross-sectional view taken along a line A-A of FIG. 4.

FIG. 4 is a layout diagram of a semiconductor memory device according to some embodiments. FIG. 5 is a cross-sectional view taken along a line A-A of FIG. 4. FIGS. 6 to 9 are enlarged views of parts P, Q, R and S of FIG. 5.

Referring to FIG. 4, the semiconductor memory device according to some embodiments may include a peripheral logic structure PS, a horizontal conductive substrate USB, and a stacked structure ST.

The stacked structure ST includes a cell array region CR and a cell extension region CER.

A memory cell array (e.g., 20 in FIG. 1) including a plurality of memory cells may be formed in the cell array region CR. In an implementation, a vertical structure VS and a bit line BL, which will be described below, may be formed in the cell array region CR.

The cell extension region CER may be around the cell array region CR. In an implementation, the cell array region CR and the cell extension region CER may extend along a direction in which the block separation region WLC extends. In an implementation, the cell array region CR and the cell extension region CER may extend along a second (e.g., horizontal) direction D2. A plurality of electrode pads EP1 to EP8, which will be described below, may be stacked stepwise in the cell extension region CER.

The stacked structure ST may include memory cell blocks (e.g., BLK1 to BLKn) separated by the block separation region WLC.

In an implementation, the cell extension region CER may be on one side of the cell array region CR, as illustrated in FIG. 4. In an implementation, the cell extension region CER may be disposed on both sides of the cell array region CR with the cell array region CR interposed therebetween.

In an implementation, a single stacked structure ST may be on the peripheral logic structure PS. In an implementation, two or more stacked structures ST may be on the peripheral logic structure PS.

A first penetration electrode region THV_R1 may be defined by a peripheral logic structure PS that does not overlap a horizontal conductive substrate USB in a third (e.g., vertical) direction D3. The first penetration electrode region THV_R1 may extend in a first (e.g., horizontal) direction D1.

A second penetration electrode region THV_R2 may be defined by the stacked structure ST. In an implementation, the second penetration electrode region THV_R2 may be defined as a region extending in the second direction D2. In an implementation, the second penetration electrode region THV_R2 may be defined only in the cell array region CR and not defined in the cell extension region CER. In an implementation, the second penetration electrode region THV_R2 may be defined in all the memory cell blocks BLK1 to BLKn.

A plate contact plug region PCC_R may be defined on the horizontal conductive substrate USB that does not overlap the stacked structure ST. The plate contact plug region PCC_R may extend along the first direction D1. The plate contact plug region PCC_R is defined to be closer to the stacked structure ST than the first penetration electrode region THV_R1.

The first penetration electrode region THV_R1 and the second penetration electrode region THV_R2 may be regions in which the penetration electrodes (THV1 and THV2 of FIG. 5) are disposed. The plate contact plug region PCC_R may be a region in which the plate contact plug (PCC1 of FIG. 5) is disposed. This will be described more specifically below in the description of FIG. 5.

Referring to FIGS. 4 to 9, the semiconductor memory device 10 according to some embodiments may include a peripheral logic structure PS and a cell array structure CS.

The peripheral logic structure PS may include a peripheral circuit PTR, a lower connection wiring body PW, and a peripheral logic insulation film 110.

The peripheral circuit PTR may be on the substrate 100. The peripheral circuit PTR may be included in the page buffer 35 of FIG. 1 or may be included the row decoder 33 of FIG. 1.

The substrate 100 may be bulk silicon or SOI (silicon-on-insulator). In an implementation, the substrate 100 may be a silicon substrate or may include other material, e.g., silicon germanium, SGOI (silicon germanium on insulator), indium antimonide, lead telluride, indium arsenide, indium phosphide, gallium arsenide, or gallium antimonide. As used herein, the term "or" is not an exclusive term, e.g., "A or B" would include A, B, or A and B.

The peripheral logic insulation film 110 may be formed on the substrate 100. The peripheral logic insulation film 110 may include, e.g., silicon oxide, silicon nitride, silicon oxynitride, or a low dielectric constant material. The low-dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The lower connection wiring body PW may be in the peripheral logic insulation film 110. The lower connection wiring body PW may be connected to the peripheral circuit PTR.

The cell array structure CS may include a horizontal conductive substrate USB on the peripheral logic structure PS, and a stacked structure ST on the horizontal conductive substrate USB.

The horizontal conductive substrate USB may be on the peripheral logic structure PS. The horizontal conductive substrate USB may include a first opening OP1. The first opening OP1 may expose or be open to a part of the peripheral logic structure PS.

The horizontal conductive substrate USB may be a common source plate. In an implementation, the horizontal conductive substrate USB may serve as the common source line CSL of FIG. 3.

The horizontal conductive substrate USB may include a conductive semiconductor film, a metal silicide film, or a metal film. If the horizontal conductive substrate USB includes a conductive semiconductor film, the horizontal conductive substrate USB may include, e.g., silicon (Si), germanium (Ge), silicon germanium (SiGe), gallium arsenide (GaAs), indium gallium arsenic (InGaAs), aluminum gallium arsenide (AlGaAs), or a combination thereof. The horizontal conductive substrate USB may have a crystal structure including a single crystal, amorphous, or polycrystal structure. The horizontal conductive substrate USB may include p-type impurities, n-type impurities, or carbon contained in the semiconductor film.

In an implementation, the horizontal conductive substrate USB may be formed as a plurality of layers or a single layer.

A filling insulation film 148 may be on the peripheral logic structure PS. The filling insulation film 148 may fill the first opening OP1. The filling insulation film 148 may include, e.g., silicon oxide, silicon oxynitride, silicon nitride, or a low dielectric constant material.

The stacked structure ST may be on the horizontal conductive substrate USB. The stacked structure ST may cover a part of the horizontal conductive substrate USB.

In an implementation, the horizontal conductive substrate USB may include a first region that overlaps the stacked structure ST in the third direction D3, and a second region that does not overlap the stacked structure ST in the third direction D3. The second region of the horizontal conductive substrate USB may include the plate contact plug region PCC_R of FIG. 4.

The stacked structure ST may include a plurality of electrode pads EP1, EP2, EP3, EP4, EP5, EP6, EP7 and EP8 stacked in the third direction D3. The stacked structure ST may include an inter-electrode insulation film ILD between the plurality of electrode pads EP1, EP2, EP3, EP4, EP5, EP6, EP7 and EP8. In an implementation, the stacked structure ST may include eight electrode pads, or a different number of electrode pads.

In an implementation, as illustrated in FIG. 5, the thickness of the inter-electrode insulation film ILD between the plurality of electrode pads EP1, EP2, EP3, EP4, EP5, EP6, EP7 and EP8 may be constant. In an implementation, the thickness of at least one inter-electrode insulation film ILD among the inter-electrode insulation films ILD between the plurality of electrode pads EP1 to EP8 may be more than twice as thick as the other inter-electrode insulation film ILD. In an implementation, the stacked structure ST may be divided into an upper stacked structure and a lower stacked structure on the basis of the thick inter-electrode insulation film ILD. The vertical structure VS may include a portion bent in a step shape at the portion divided into the upper stacked structure and the lower stacked structure.

The plurality of electrode pads EP1, EP2, EP3, EP4, EP5, EP6, EP7 and EP8 stacked in the third direction D3 may include a gate electrode included in the string selection transistors SST1 and SST2 and the ground selection transistor GST described in FIG. 3. In addition, the plurality of electrode pads EP1, EP2, EP3, EP4, EP5, EP6, EP7 and EP8 stacked in the third direction D3 may include word lines of the memory cells MCT.

In an implementation, the first stacked structure ST1 may include a third electrode pad EP3, a fourth electrode pad EP4, and a fifth electrode pad EP5 that are adjacent to each other in the third direction D3. The fourth electrode pad EP4 may be between the third electrode pad EP3 and the fifth electrode pad EP5.

The fourth electrode pad EP4 may protrude from or beyond the fifth electrode pad EP5 by a first width or distance in the first direction D1. In an implementation, the third electrode pad EP3 may protrude from the fourth electrode pad EP4 by a second width in the first direction D1. In an implementation, the side walls of the fourth electrode pad EP4 and the side walls of the fifth electrode pad EP5 may be laterally spaced apart from each other by the first width in the first direction D1. The side walls of the third electrode pad EP3 and the side walls of the fourth electrode pad EP4 may be laterally spaced apart from each other by the second width in the first direction D1.

In an implementation, the first width may be greater than the second width. In the semiconductor memory device according to some embodiments, the stacked structure ST may include a sub-stacked structure in which side walls of adjacent electrode pads are spaced apart from each other by the second width. In addition, the side walls of the closest electrode pads of each sub-stacked structure may be spaced apart from each other by the first width.

In an implementation, a part of the fourth electrode pad EP4 protruding by the first width in the first direction D1 from the fifth electrode pad EP5 may be defined as a flat pad region. In an implementation, the cell extension region CER may include a flat pad region. The flat pad region may be a region in which a third penetration electrode (THV3 of FIG. 13) to be described below is disposed.

In an implementation, unlike the case shown in FIG. 5, the adjacent electrode pads EP1 to EP8 may protrude by the same width in the first direction.

In an implementation, each of the electrode pads EP1 to EP8 may include, e.g., a metal such as tungsten (W), cobalt (Co) and nickel (Ni), or a semiconductor material such as silicon. Each of the electrode pads EP1 to EP8 may be formed by, e.g., a replacement process.

In an implementation, the gate electrodes included in the string selection transistors SST1 and SST2 and the ground selection transistor GST described in FIG. 3 and the word line of the memory cell MCT may include the same material.

In an implementation, the gate electrodes included in the string selection transistors SST1 and SST2 described in FIG. 3 may include materials different from the gate electrodes included in the ground selection transistors GST, and the word lines of the memory cells MCT. In an implementation, the gate electrodes included in the string selection transistors SST1 and SST2 may include a semiconductor material such as silicon. The gate electrode included in the ground selection transistor GST and the word lines of the memory cells MCT may include metal.

The stacked structure ST may include an insulating mold part IMS. The insulating mold part IMS may overlap the first opening OP1 of the horizontal conductive substrate USB in the third direction D3. The insulating mold part IMS may include the second penetration electrode region THV_R2 of FIG. 4.

The insulating mold part IMS may include an inter-electrode insulation film ILD and a sacrificial mold insulation film ILD_SC having an etching selection ratio. The inter-electrode insulation film ILD and the sacrificial mold insulation film ILD_SC may be alternately stacked. In an implementation, the inter-electrode insulation film ILD may include silicon oxide, and the sacrificial mold insulation film ILD_SC may include silicon nitride.

The block separation region WLC may be disposed in the stacked structure ST. The block separation region WLC may extend in the second direction D2. Each block separation region WLC may be spaced apart from each other in the first direction D1. Each block separation region WLC may completely cut the stacked structure ST. The mold structure ST cut by the two adjacent block separation regions WLC may form one memory cell block BLK1 to BLKn.

The block separation region WLC may include an insulating material. The block separation region WLC may include, e.g., silicon oxide. In an implementation, the block separation region WLC may include a plurality of films, and may include double films including a silicon nitride film and a silicon oxide film. In an implementation, the block separation region WLC may include a liner formed of an insulating material, and a conductive material that fills the trench defined by the liner.

The plurality of vertical structures VS may be on the horizontal conductive substrate USB. The plurality of vertical structures VS may penetrate the stacked structure ST. The plurality of vertical structures VS may be electrically connected to the horizontal conductive substrate USB. The vertical structures VS may include side wall parts that extend in the third direction D3, and a bottom part that connects the side wall parts of the vertical structure VS. The side wall parts of the vertical structures VS may have a pipe shape having a hollow space inside, e.g., a cylindrical shape or a macaroni shape.

The vertical structures VS may include, e.g., a semiconductor material such as silicon (Si), germanium (Ge), or a mixture thereof. In an implementation, the vertical structures VS may include a semiconductor material such as a metal oxide semiconductor material, an organic semiconductor material and a carbon nanostructure.

Figure 9:
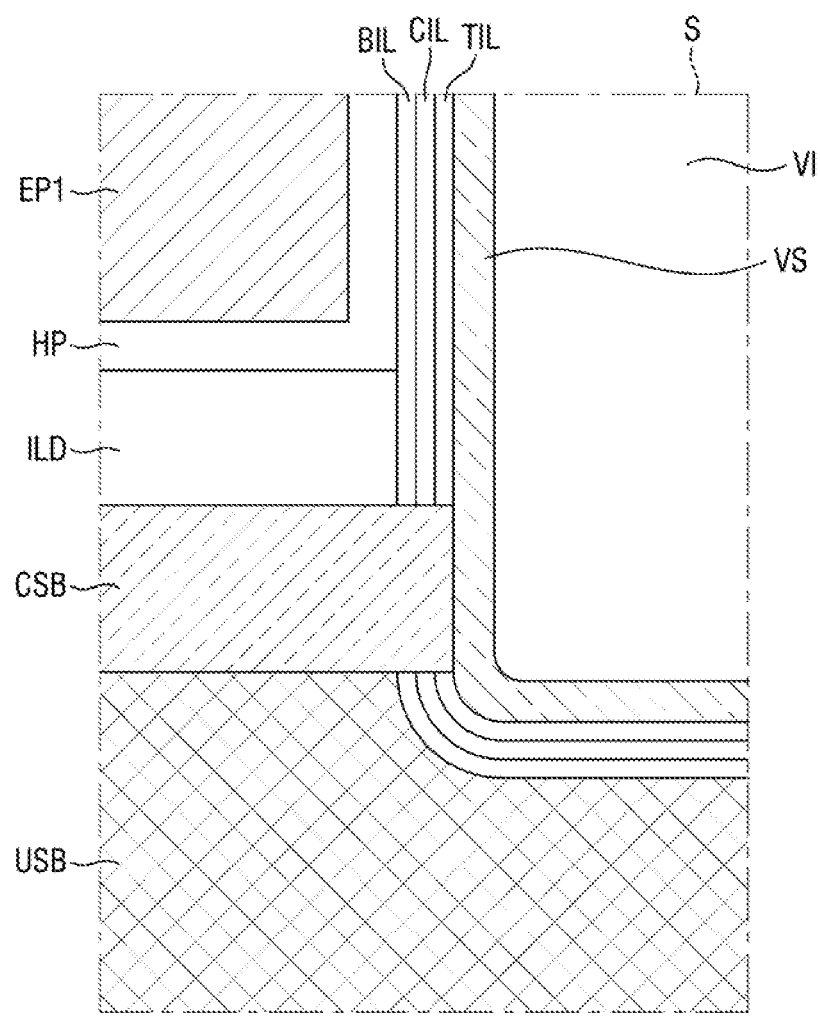

In an implementation, as illustrated in FIGS. 5 and 9, a blocking insulation film BIL, a charge storage film CIL, and a tunnel insulation film TIL may be sequentially between the vertical structures VS and the stacked structure ST.

A vertical insulation film VI may be on the vertical structure VS. The vertical insulation film VI may fill a space defined by the vertical structures VS. In an implementation, a horizontal insulation pattern HP may be between the electrode pad EP1 and the inter-electrode insulation film ILD, and between the electrode pad EP1 and the blocking insulation film BIL. The horizontal insulating pattern HP may include, e.g., silicon oxide or a high dielectric constant insulation film. In an implementation, a horizontal insulation pattern HP may not be between the electrode pad EP1 and the inter-electrode insulation film ILD, and may be between the electrode pad EP1 and the blocking insulation film BIL.

The blocking insulation film BIL, the charge storage film CIL and the tunnel insulation film TIL may be separated from the lower parts of the vertical structures VS. The separated blocking insulation film BIL, charge storage film CIL and tunnel insulation film TIL may expose a part of the side wall parts of the vertical structure VS. A vertical structure support film CSB may be between the separated blocking insulation film BIL, the charge storage film CIL and the tunnel insulation film TIL. The vertical structure support film CSB may electrically connect the horizontal conductive substrate USB and the vertical structure VS. The vertical structure support film CSB may include a semiconductor material such as silicon (Si), germanium (Ge) or a mixture thereof.

In an implementation, the vertical structure support film CSB may not be between the horizontal conductive substrate USB and the stacked structure ST. In such a case, the side wall parts of the vertical structures VS may not be exposed, and the bottom parts of the vertical structure VS may be exposed. The blocking insulation film BIL, the charge storage film CIL and the tunnel insulation film TIL between the bottom parts of the vertical structures VS and the horizontal conductive substrate USB may be removed. The vertical structures VS may be electrically connected to the horizontal conductive substrate USB through the bottom parts of the vertical structures VS.

The first interlayer insulation film 142 may be on the peripheral logic structure PS. The first interlayer insulation film 142 may cover the stacked structure ST1 and the horizontal conductive substrate USB.

The second interlayer insulation film 144 and the third interlayer insulation film 146 may be sequentially formed on the first interlayer insulation film 142. A part of the block separation region WLC may extend to the second interlayer insulation film 144.

The first interlayer insulation film 142, the second interlayer insulation film 144 and the third interlayer insulation film 146 may include, e.g. silicon oxide, silicon oxynitride, or a low dielectric constant material.

The bit lines BL may be on the stacked structure ST. The bit lines BL may extend in the first direction D1. The bit lines BL may be electrically connected to at least one of the plurality of vertical structures VS.

The bit lines BL may be on the third interlayer insulation film 153. The bit lines BL may be electrically connected to the vertical structures VS via a bit line pad BL_PAD and a bit line plug BL_PG. The bit lines BL, the bit line pad BL_PAD, and the bit line plug BL_PG each include a conductive material.

The plurality of electrode plugs WL_PG may be in the first to third interlayer insulation films 142, 144 and 146. The plurality of electrode plugs WL_PG may be in the cell extension region CER.

Each electrode plug WL_PG may be electrically connected to the respective electrode pads EP1 to EP8. The respective electrode plugs WL_PG may connect the respective electrode pads EP1 to EP8 and the word line connection wiring WL_CW.

Figure 7:
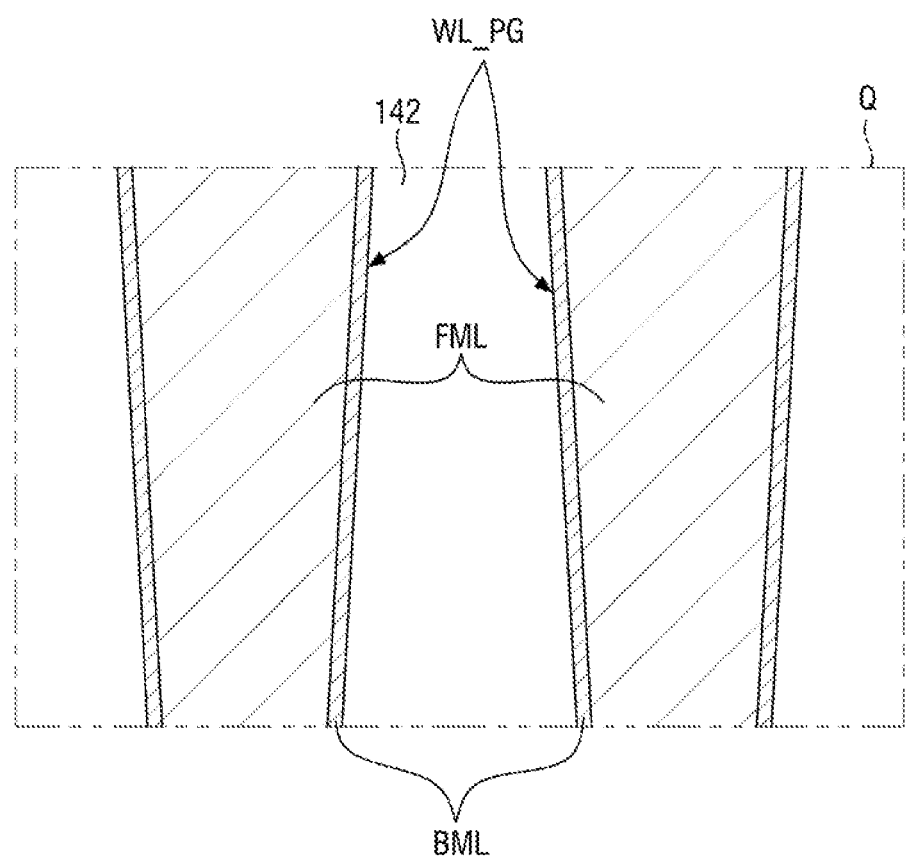

In an implementation, the side walls of the electrode plugs WL_PG may be linear, as illustrated in FIGS. 5 and 7. In an implementation, at least a part of the side walls of the electrode plugs WL_PG may have a convex curve shape.

The first penetration electrode THV1 may be in the first penetration electrode region THV_R1. The first penetration electrode THB1 may extend in the third direction D3. The first penetration electrode THV1 may be in the first to third interlayer insulation films 142, 144 and 146 and the peripheral logic insulation film 110. The first penetration electrode THV1 may not penetrate the stacked structure ST. The first penetration electrode THV1 may be connected to the lower connection wiring body PW and the first penetration electrode connection wiring THV1_CW.

The first plate contact plug PCC1 may be in the plate contact plug region PCC_R. The first plate contact plug PCC1 may extend in the third direction D3. The first plate contact plug PCC1 may be in the first to third interlayer insulation films 142, 144 and 146. The first plate contact plug PCC1 may not penetrate the stacked structure ST.

The first plate contact plug PCC1 may be connected to the horizontal conductive substrate USB. The first plate contact plug PCC1 may be electrically connected to the horizontal conductive substrate USB in the second region of the horizontal conductive substrate USB. The first plate contact plug PCC1 may be connected to the first plate contact connection wiring PCC1_CW. A part of the first plate contact plug PCC1 may be in the horizontal conductive substrate USB.

The second penetration electrode THV2 may be in the second penetration electrode region THV_R2. The second penetration electrode THB2 may extend in the third direction D3. The second penetration electrode THV2 may be in the insulating mold part IMS, the filling insulation film 148, and the peripheral logic insulation film 110. The second penetration electrode THV2 may penetrate the stacked structure ST, e.g., the insulating mold part IMS. The second penetration electrode THV2 may be in the cell array region CR. The second penetration electrode THV2 may pass through the first opening OP1. The second penetration electrode THV2 may be connected to the lower connection wiring body PW and the second penetration electrode connection wiring THV2_CW.

In an implementation, an upper surface 201us (e.g., surface facing away from the substrate 100 in the third direction D3) of the first penetration electrode THV1 and an upper surface 211us of the first plate contact plug PCC1 may be on the same plane (e.g., may be coplanar). In an implementation, the upper surface 211us of the first plate contact plug PCC1 may be on the same plane as an upper surface 203us of the second penetration electrode THV2. Upper surfaces 215us of the plurality of electrode plugs WL_PG may be on the same plane as the upper surface 211us of the first plate contact plug.

Figure 6:
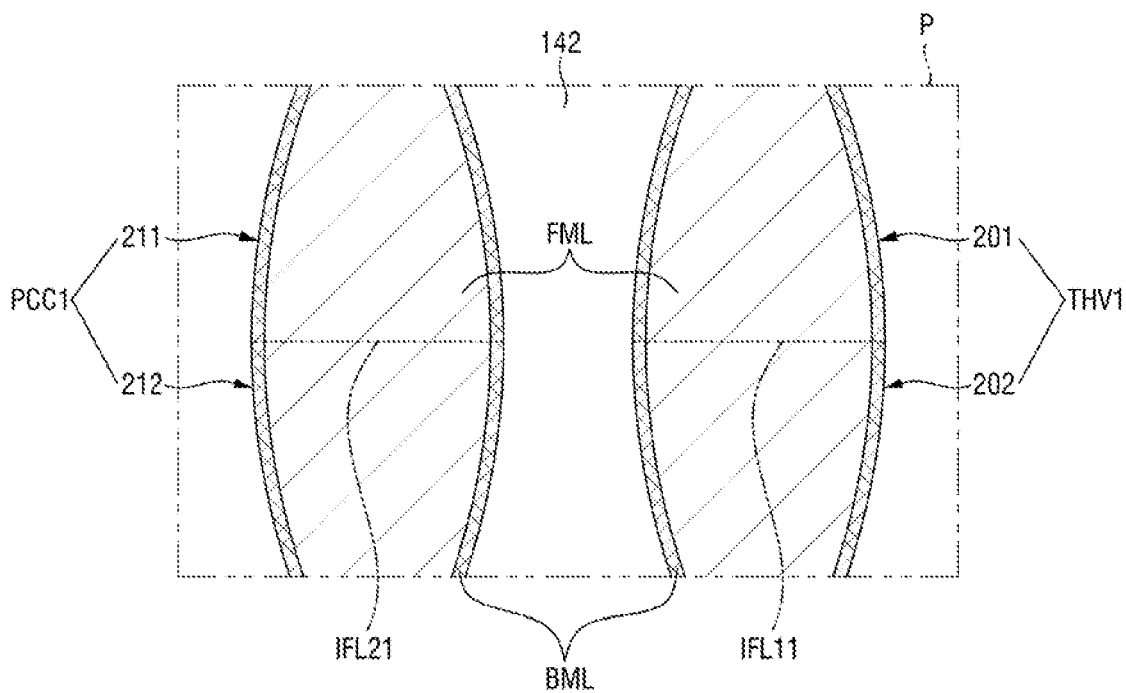
FIGS. 6 to 9 are enlarged views of parts P, Q, R and S of FIG. 5.

In FIGS. 5 and 6, the first penetration electrode THV1 may include an upper part 201 and a lower part 202 that are directly connected to each other (e.g., forming a continuous or monolithic structure). The first penetration electrode THV1 may include a first_1 boundary IFL11 at which the upper part 201 and the lower part 202 form a boundary. Moving away from the upper surface 201us of the first penetration electrode THV1 in the third direction D3 (e.g., toward the substrate 100), the width (e.g., in horizontal direction) of the upper part 201 of the first penetration electrode may increase. Moving away from the upper surface 201us of the first penetration electrode THV1 in the third direction D3 (e.g., toward the substrate 100), the width of the lower part 202 of the first penetration electrode may decrease. In a direction extending away from the upper surface 201us of the first penetration electrode THV1 in the third direction D3 (e.g., toward the substrate 100), the width of the first penetration electrode THV1 may increase and then decrease (e.g., on either side of the first_1 boundary IFL11). For example, the first penetration electrode THV1 may have a tapered shape that increases in width until the first_1 boundary IFL11, and then decreases in width.

The first penetration electrode THV1 may have a maximum width (e.g., a width in the first direction D1) at the first_1 boundary IFL11. A height (e.g., in the third direction D3) from the point or plane (e.g., the first_1 boundary IFL11) at which the first penetration electrode THV1 has the maximum width to the upper surface 201us of the first penetration electrode THV1 may be a first height H21. At least a part of the side walls of the first penetration electrode THV1 may include a convex curved surface. The first_1 boundary IFL11, at which the first penetration electrode THV1 has the maximum width, may be located at a portion in which the first penetration electrode THV1 has a convex curved surface.

In an implementation, as illustrated in FIGS. 5 and 6, the first plate contact plug PCC1 may include an upper part 211 and a lower part 212 directly connected to each other. The first plate contact plug PCC1 may include a second_1 boundary IFL21 at which the upper part 211 of the first plate contact plug and the lower part 212 of the first plate contact plug form a boundary. Moving away from the upper surface 201us of the first penetration electrode in the third direction D3, the width of the upper part 211 of the first plate contact plug may increase. Moving away from the upper surface 201us of the first penetration electrode in the third direction D3, the width of the lower part 212 of the first plate contact plug may decrease. Moving away from the upper surface 211us of the first plate contact plug in the third direction D3, the width of the first plate contact plug PCC1 may increase and then decrease (e.g., on opposite sides of the second_1 boundary IFL21).

The first plate contact plug PCC1 may have a maximum width (e.g., a width in the first direction D1) at the second_1 boundary IFL21. A height (in the third direction D3) from the point or plane of the second_1 boundary IFL21 (at which the first plate contact plug PCC1 has the maximum width) to the upper surface 211us of the first plate contact plug may be a second height H22. At least a part of the side walls of the first plate contact plug PCC1 may include a convex curved surface. The second_1 boundary IFL21 (at which the first plate contact plug PCC1 has the maximum width) may be at a portion in which the first plate contact plug PCC1 has a convex curved surface.

Figure 8:
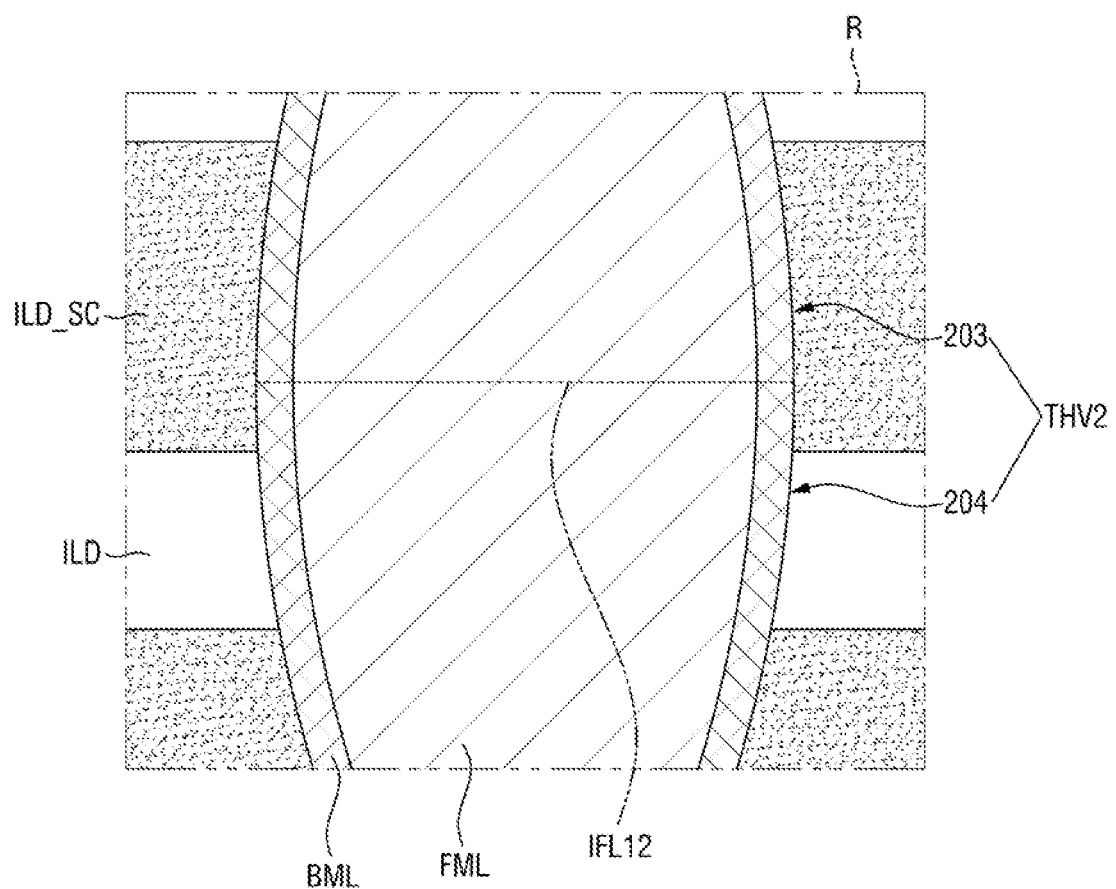

As illustrated in FIGS. 5 and 8, the second penetration electrode THV2 may include an upper part 203 and a lower part 204 directly connected to each other. The second penetration electrode THV2 may include a first_2 boundary IFL12 at which an upper part 203 of the second penetration electrode and a lower part 204 of the second penetration electrode form a boundary. Moving away from the upper surface 203us of the second penetration electrode in the third direction D3, the width of the upper part 203 of the second penetration electrode may increase. Moving away from the upper surface 203us of the second penetration electrode in the third direction D3, the width of the lower part 204 of the second penetration electrode may decrease. Moving away from the upper surface 203us of the second penetration electrode in the third direction D3, the width of the second penetration electrode THV2 may increase and then decrease.

The second penetration electrode THV2 may have a maximum width (e.g., a width in the first direction D1) at the first_2 boundary IFL12. A height from the point or plane of the first_2 boundary IFL12, at which the second penetration electrode THV2 has the maximum width to the upper surface 203us of the second penetration electrode may be a third height H23. At least a part of the side wall of the second penetration electrode THV2 includes a convex curved surface. The first_2 boundary IFL12 at which the second penetration electrode THV2 has the maximum width is located in the portion in which the second penetration electrode THV2 has a convex curved surface.

In an implementation, the first_1 boundary IFL11 of the first penetration electrode THV1 may be at a same vertical level as the second_1 boundary IFL21 of the first plate contact plug PCC1 (e.g., they may be coplanar), on the basis of or relative to the upper surface 201us of the first penetration electrode or the upper surface of the horizontal conductive substrate USB. In an implementation, the plane at which the first penetration electrode THV1 has the maximum width may be at the same vertical level as the plane at which the first plate contact plug PCC1 has the maximum width.

Here, the term "same vertical level" means not only a case in which the heights at the two positions to be compared are completely the same, but also a minute difference in height that may occur due to process margins and the like.

In an implementation, when the relationship between the first height H21 in the first penetration electrode THV1 and the second height H22 in the first plate contact plug PCC1 is as follows, it may be said that they are located on the "same vertical level".

The height of the first penetration electrode THV1 in the third direction D3 may be a first_1 height H1. The first height H21 at the first penetration electrode THV1 and the second height H22 at the first plate contact plug PCC1 may each be greater than zero. The difference between the first height H21 and the second height H22 may be greater than or equal to zero. In an implementation, the difference between the first height H21 and the second height H22 may be smaller than or equal to 0.15% of the first height H. In an implementation, the difference between the first height H21 and the second height H22 may be smaller than or equal to H×0.0015. In an implementation, if the height H1 of the first penetration electrode THV1 were 2,000 nm and the difference between the first height H21 and the second height H22 were 3 nm, the plane at which the first penetration electrode THV1 has the maximum width may be located at the same vertical level as the plane which the first plate contact plug PCC1 has the maximum width.

In an implementation, the first_1 boundary IFL11 of the first penetration electrode THV1 may be higher than the first_2 boundary IFL12 of the second penetration electrode THV2, relative to the upper surface of the horizontal conductive substrate USB. In an implementation, the plane at which the first penetration electrode THV1 has the maximum width may be higher than (e.g., farther from the upper surface of the horizontal conductive substrate USB in the third direction D3 than) the plane at which the second penetration electrode THV2 has the maximum width.

In an implementation, the first height H21 at the first penetration electrode THV1 may be smaller than the third height H23 at the second penetration electrode THV2.

In FIGS. 6 to 8, the electrode plugs WL_PG, the first penetration electrode THV1, the second penetration electrode THV2, and the first plate contact plug PCC1 may include a barrier conductive film BML, and a filling conductive film FML, respectively. The electrode plugs WL_PG, the first penetration electrode THV1, the second penetration electrode THV2 and the first plate contact plug PCC1 may be formed at the same level. Here, the term "same level" means that they are formed by the same fabricating process.

The electrode plugs WL_PG, the first penetration electrode THV1, the second penetration electrode THV2, and the first plate contact plug PCC1 may have the same conductive film stacked structure. The barrier conductive film BML may include a metal, a metal nitride, a metal carbonitride, or a two-dimensional (2D) material. In an implementation, the two-dimensional material may be a metallic material or a semiconductor material. The two-dimensional (2D) material may include a 2D allotrope or a 2D compound. The filling conductive film FML may include a metal, a metal nitride, a metal carbonitride, or a conductive semiconductor material.

In an implementation, the electrode plugs WL_PG, the first penetration electrode THV1, the second penetration electrode THV2, and the first plate contact plug PCC1 may include only the filling conductive film FML.

The first penetration electrode connection wiring THV1_CW, the second penetration electrode connection wiring THV2_CW, the first plate contact connection wiring PCC1_CW and the word line connection wiring WL_CW may each include a conductive material.

Figure 10:
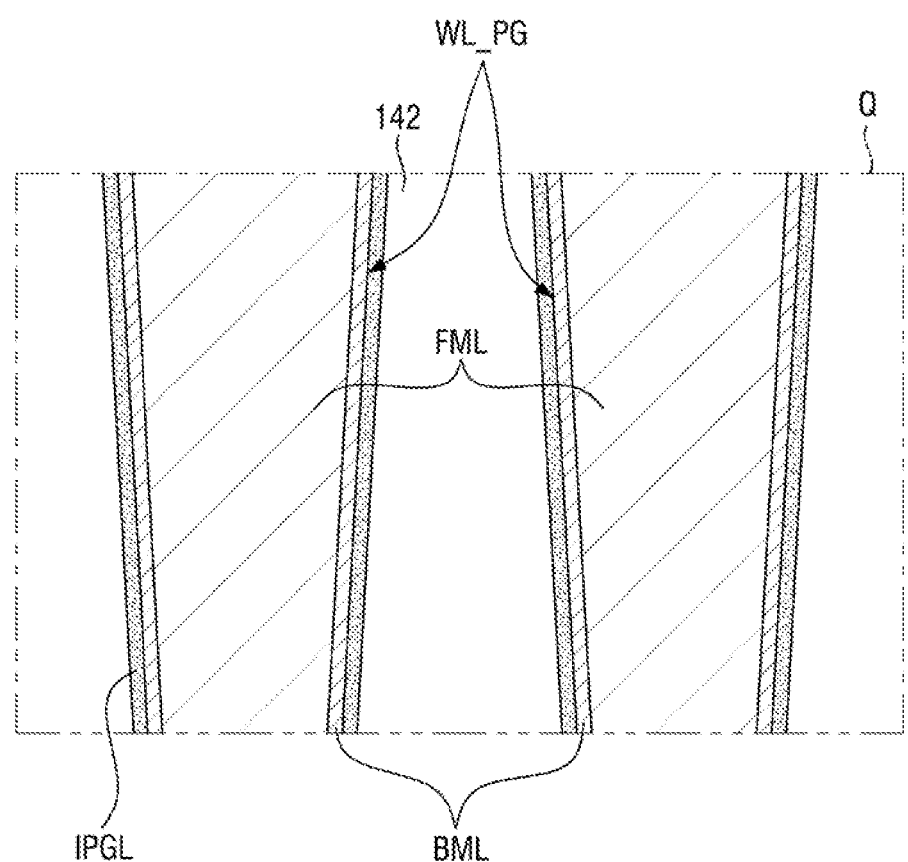
FIG. 10 is an enlarged cross sectional view of the semiconductor memory device according to some embodiments.

FIG. 10 is a diagram of the semiconductor memory device according to some embodiments. For convenience of description, differences from those described using FIGS. 4 to 9 will be mainly described. For reference, FIG. 10 is an enlarged view of a part Q of FIG. 5.

Referring to FIG. 10, in the semiconductor memory device according to some embodiments, the electrode plug WL_PG may further include an insulating plug liner IPGL on the side walls of the electrode plug WL_PG.

The insulating plug liner IPGL may extend along the side walls of the electrode plug WL_PG. The insulating plug liner IPGL may include an insulating material, e.g., siliconite.

The insulating plug liner IPGL may not be on the side walls of the first penetration electrode THV1, may not be on the side walls of the second penetration electrode THV2, and may not be on the side walls of the first plate contact plug PCC1.

Figure 11:
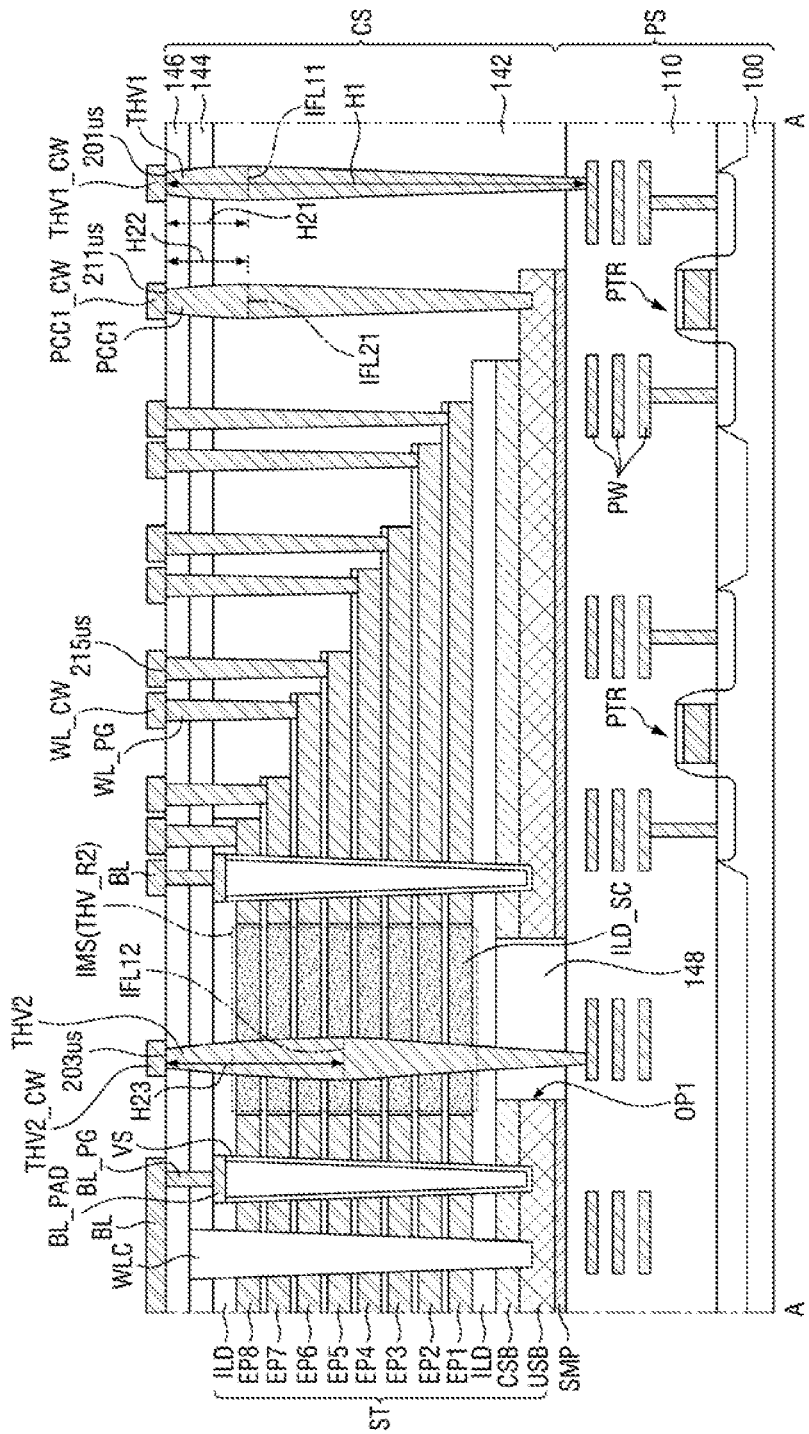
FIG. 11 is a cross-sectional view of the semiconductor memory device according to some embodiments.
Figure 12:
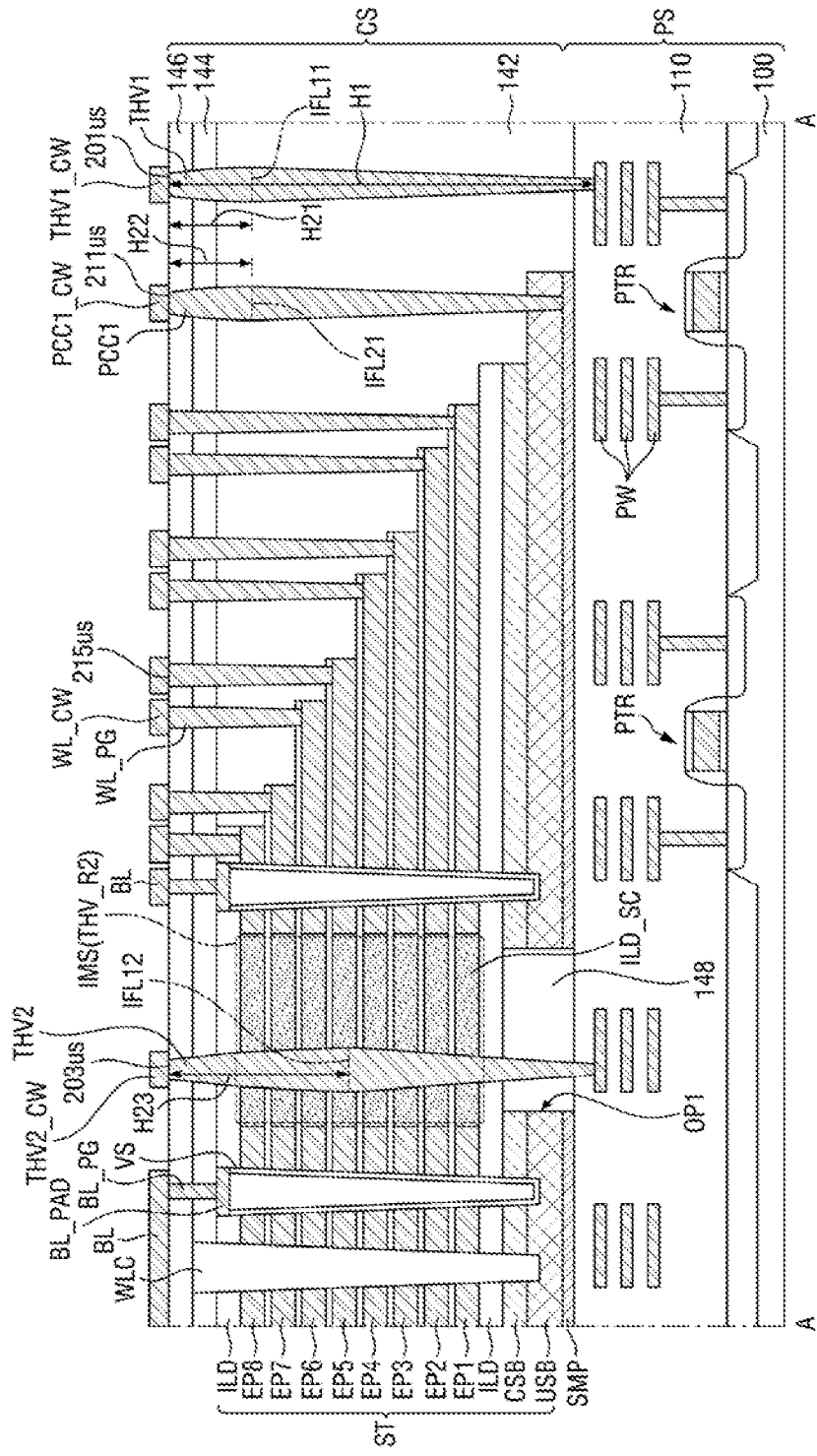
FIG. 12 is a cross-sectional view of the semiconductor memory device according to some embodiments.

FIG. 11 is a diagram of the semiconductor memory device according to some embodiments. FIG. 12 is a diagram of the semiconductor memory device according to some embodiments. For convenience of description, differences from those described using FIGS. 4 to 9 will be mainly described.

Referring to FIGS. 11 and 12, a semiconductor memory device according to some embodiments may further include a metallic plate film SMP between the lower connection wiring body PW and the horizontal conductive substrate USB.

The metallic plate film SMP may extend along the lower surface of the horizontal conductive substrate USB. The metallic plate film SMP may include an opening at a position corresponding to the first opening OP1. In an implementation, the metallic plate film SMP may be in contact (e.g., direct contact) with the horizontal conductive substrate USB. In an implementation, the metallic plate film SMP may be spaced apart from the horizontal conductive substrate USB in the third direction D3.

The metallic plate film SMP may include, e.g., a metal.

In an implementation, the side walls of the metallic plate film SMP may be aligned with the side walls of the horizontal conductive substrate USB in the third direction D3.

In FIG. 11, a part of the first plate contact plug PCC1 may be inserted into (e.g., partially through) the horizontal conductive substrate USB. In an implementation, the first plate contact plug PCC1 may not be in direct contact with the metallic plate film SMP.

In FIG. 12, the first plate contact plug PCC1 may penetrate (e.g., completely penetrate) the horizontal conductive substrate USB. The first plate contact plug PCC1 may be in direct contact with the metallic plate film SMP.

Figure 13:
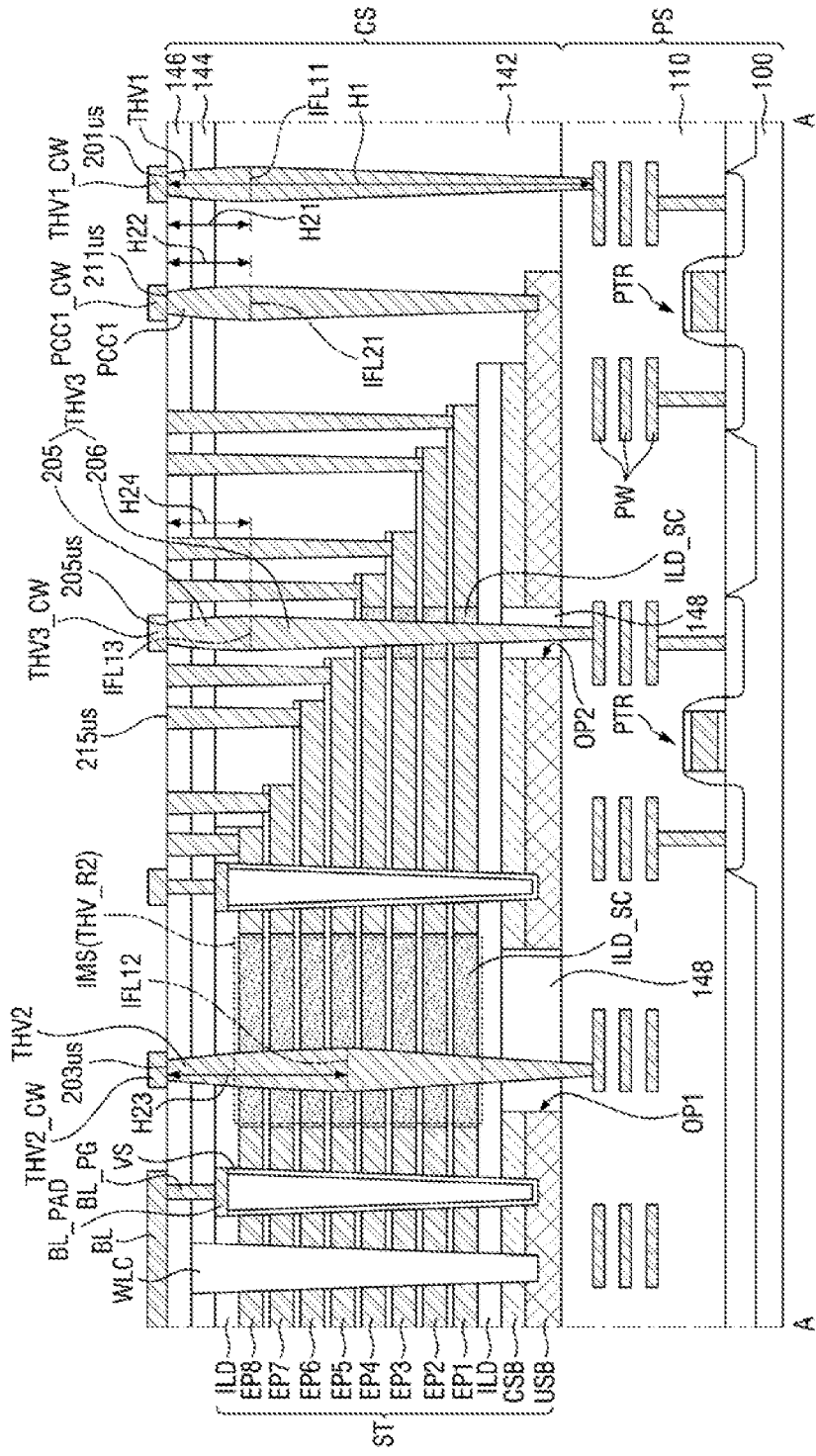
FIG. 13 is a cross-sectional view of the semiconductor memory device according to some embodiments.

FIG. 13 is a diagram of the semiconductor memory device according to some embodiments. For convenience of description, differences from those described using FIGS. 4 to 9 will be mainly described.

Referring to FIGS. 4 and 13, the semiconductor memory device according to some embodiments may further include a third penetration electrode THV3 in the cell extension region CER.

The horizontal conductive substrate USB may include a second opening OP2. The second opening OP2 may be at a position overlapping the cell extension region CER.

The third penetration electrode THV3 may be between the electrode plugs WL_PG. The third penetration electrode THV3 may be in the flat pad region of the cell extension region CER. The electrode plugs WL_PG around the third penetration electrode THV3 may be, e.g., dummy plugs that are not connected to the word line connection wiring WL_CW.

The third penetration electrode THV3 may be in the first to third interlayer insulation films 142, 144 and 146, the inter-electrode insulation film ILD and the sacrificial mold insulation film ILD_SC that are alternately stacked, the filling insulation film 148 and the peripheral logic insulation film 110. The third penetration electrode THV3 may penetrate the inter-electrode insulation film ILD and the sacrificial mold insulation film ILD_SC of the cell extension region CER of the stacked structure ST. The third penetration electrode THV3 may pass through the second opening OP2. The third penetration electrode THV3 may be connected to the lower connection wiring body PW and the third penetration electrode connection wiring THV3_CW.

The upper surface 205us of the third penetration electrode may be on the same plane as the upper surface 201us of the first penetration electrode.

The third penetration electrode THV3 may include an upper part 205 and a lower part 206 directly connected to each other. The third penetration electrode THV3 may include a first_3 boundary IFL13 at which the upper part 205 of the third penetration electrode and the lower part 206 of the third penetration electrode form a boundary. Moving away from the upper surface 205us of the third penetration electrode in the third direction D3, the width of the upper part 205 of the third penetration electrode may increase. Moving away from the upper surface 205us of the third penetration electrode in the third direction D3, the width of the lower part 206 of the third penetration electrode may decrease. Moving away from the upper surface 205us of the third penetration electrode in the third direction D3, the width of the third penetration electrode THV3 may increase and then decrease.

The third penetration electrode THV3 has a maximum width (e.g., a width in the first direction D1) at the first_3 boundary IFL13. A height from the plane of the first_3 boundary IFL13 at which the third penetration electrode THV3 has the maximum width to the upper surface 205us of the third penetration electrode may be a fourth height H24. At least a part of the side walls of the third penetration electrode THV3 may include a convex curved surface. The first_3 boundary IFL13 at which the third penetration electrode THV3 has the maximum width may be located at a portion at which the third penetration electrode THV3 has a convex curved surface.

In an implementation, relative to the upper surface 201us of the first penetration electrode or the upper surface of the horizontal conductive substrate USB, the first_1 boundary IFL11 of the first penetration electrode THV1 may be at the same vertical level as the first_3 boundary IFL13 of the third penetration electrode THV3.

The third penetration electrode THV3 and the first penetration electrode THV1 may be at the same level. The third penetration electrode THV3 and the first penetration electrode THV1 may have the same conductive film stacked structure.

Figure 14:
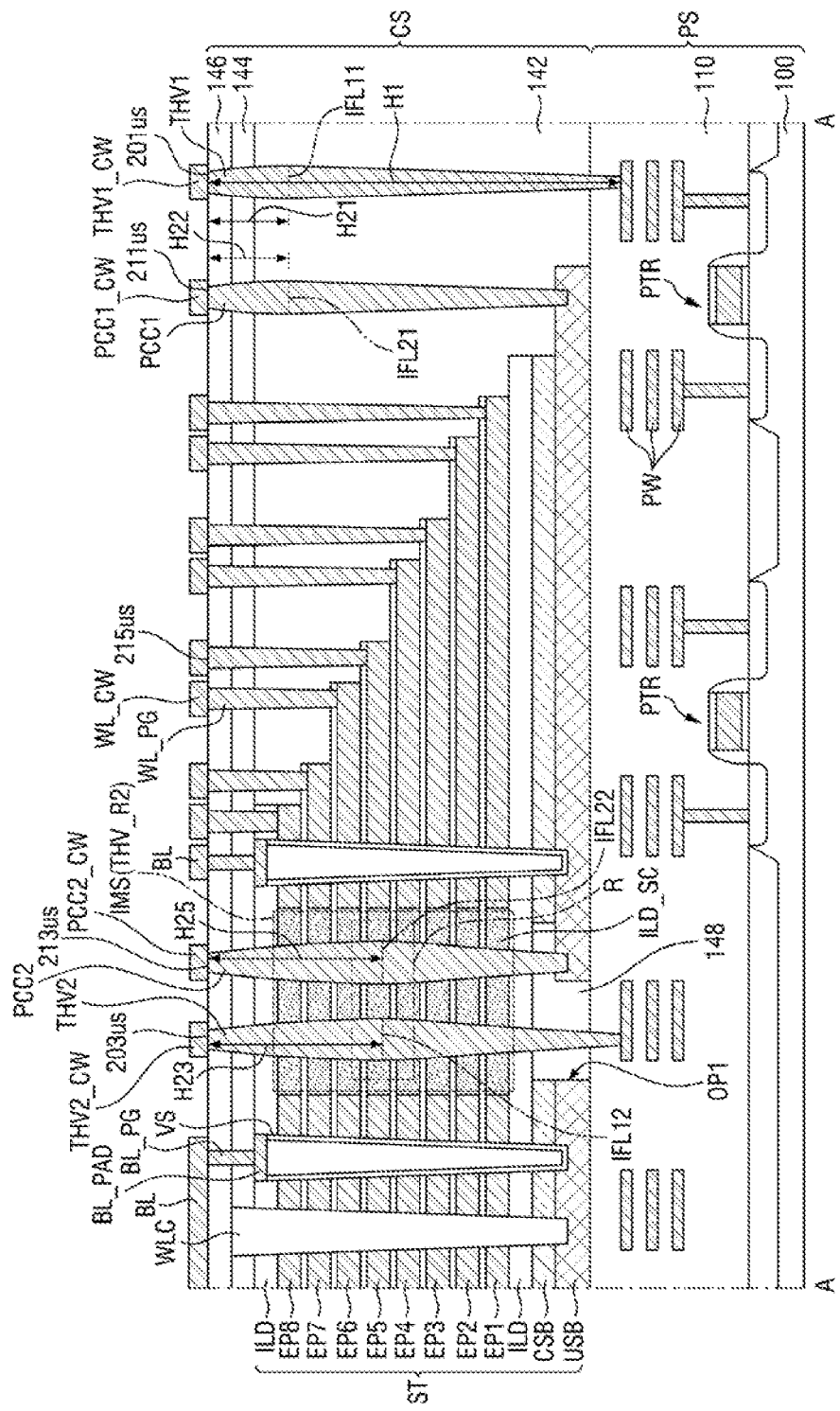
FIGS. 14 and 15 are cross-sectional views of the semiconductor memory device according to some embodiments.
Figure 15:
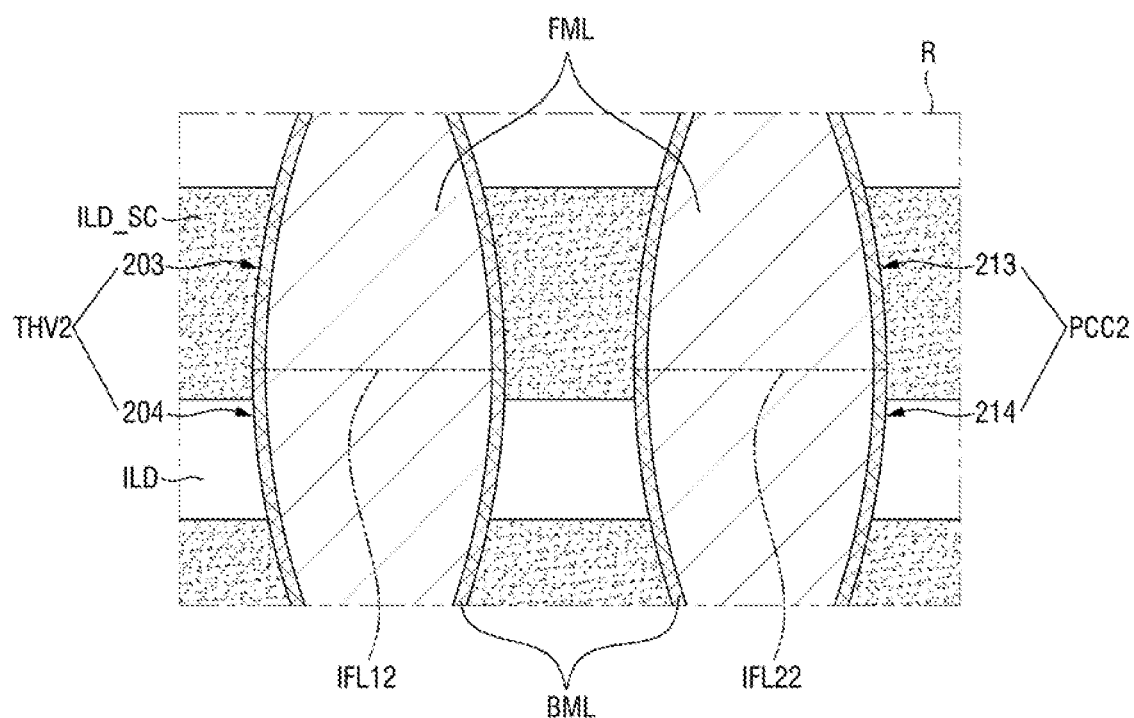

FIGS. 14 and 15 are diagrams of a semiconductor memory device according to some embodiments. For convenience of description, differences from those described using FIGS. 4 to 9 will be mainly described. For reference, FIG. 14 is a cross-sectional view taken along a line A-A of FIG. 4, and FIG. 15 is an enlarged view of a part R of FIG. 14.

Referring to FIGS. 14 and 15, the semiconductor memory device according to some embodiments may further include a second plate contact plug PCC2.

The second plate contact plug PCC2 may be in the second penetration electrode region THV_R2. The second plate contact plug PCC2 may extend in the third direction D3. The second plate contact plug PCC2 may be in the insulating mold part IMS. The second plate contact plug PCC2 may penetrate the stacked structure ST, e.g., the insulating mold part IMS.

The second plate contact plug PCC2 may be connected to the horizontal conductive substrate USB. The second plate contact plug PCC2 may be electrically connected to the horizontal conductive substrate USB in the second region of the horizontal conductive substrate USB. The second plate contact plug PCC2 may be connected to the second plate contact connection wiring PCC2_CW.

In an implementation, the upper surface 203us of the second penetration electrode and the upper surface 213us of the second plate contact plug may be on the same plane.

The second plate contact plug PCC2 may include an upper part 213 and a lower part 214 that are directly connected to each other. The second plate contact plug PCC2 may include a second_2 boundary IFL22 at which the upper part 213 of the second plate contact plug and the lower part 214 of the second plate contact plug form a boundary. Moving away from the upper surface 213us of the second plate contact plug PCC2 in the third direction D3, the width of the upper part 213 of the second plate contact plug PCC2 may increase. Moving away from the upper surface 213us of the second plate contact plug PCC2 in the third direction D3, the width of the lower part 214 of the second plate contact plug PCC2 may decrease. Moving away from the upper surface 213us of the second plate contact plug PCC2 in the third direction D3, the width of the second plate contact plug PCC2 may increase and then decrease.

The second plate contact plug PCC2 may have a maximum width (e.g., a width in the first direction D1) at the second_2 boundary IFL22. A height from the plane of the second_2 boundary IFL22 at which the second plate contact plug PCC2 has the maximum width to the upper surface 213us of the second plate contact plug PCC2 may be a fifth height H25. At least a part of the side walls of the second plate contact plug PCC2 includes a convex curved surface. The second_2 boundary IFL22, at which the second plate contact plug PCC2 has the maximum width, may be located at the portion in which the second plate contact plug PCC2 has a convex curved surface.

In an implementation, the first_2 boundary IFL12 of the second penetration electrode THV2 may be located at the same vertical level as the second_2 boundary IFL22 of the second plate contact plug PCC2, relative to the upper surface 203us of the second penetration electrode THV2 or the upper surface of the horizontal conductive substrate USB. In an implementation, the plane at which the second penetration electrode THV2 has the maximum width may be at the same vertical level as the plane on which the second plate contact plug PCC2 has the maximum width.

The second plate contact plug PCC2 may be at the same level as the second penetration electrode THV2. The second plate contact plug PCC2 and the second penetration electrode THV2 may have the same conductive film stacked structure. The second plate contact plug PCC2 may include a barrier conductive film BML and a filling conductive film FML.

FIGS. 16 to 19 illustrate stages in a method of fabricating a semiconductor memory device according to some embodiments.

Figure 16:
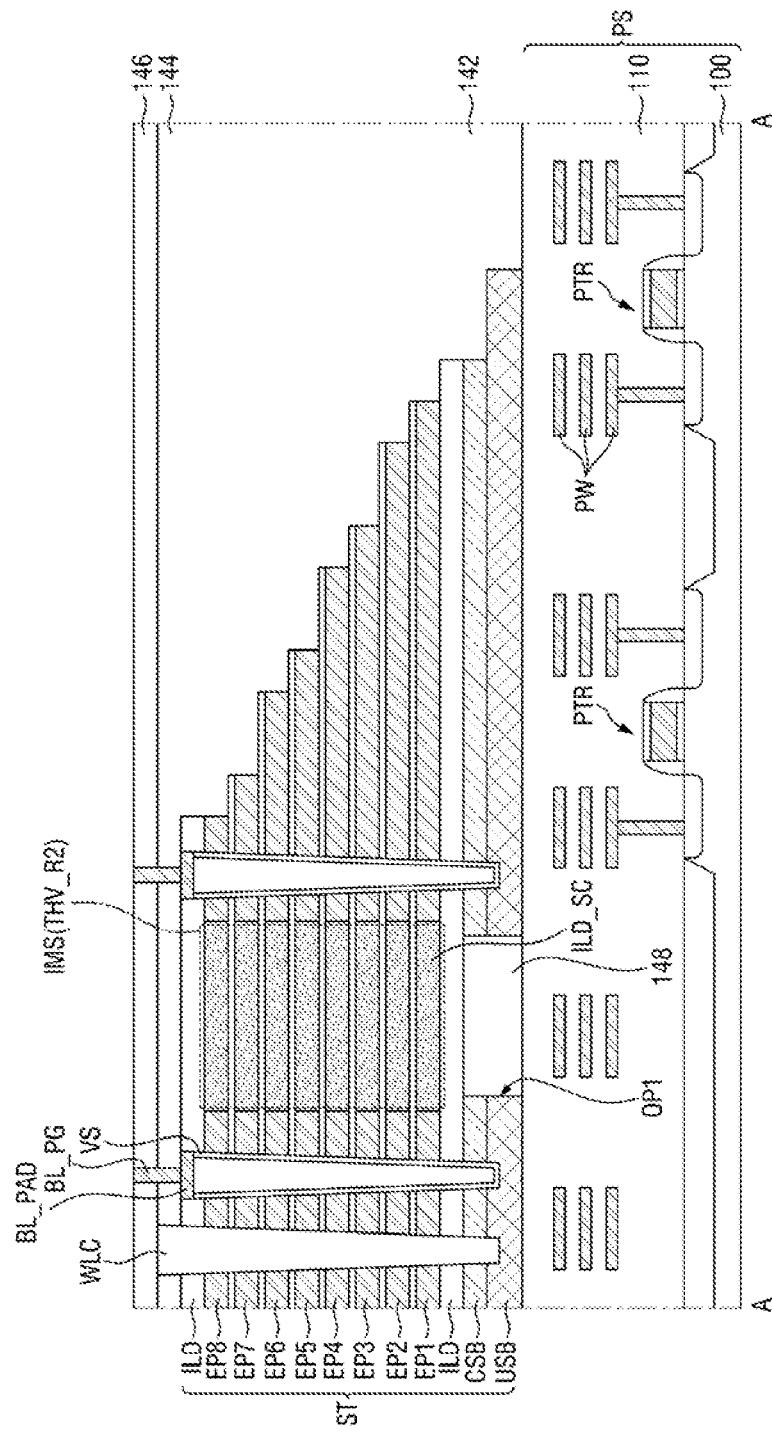
FIGS. 16 to 19 are cross-sectional views of stages in a method of fabricating a semiconductor memory device according to some embodiments.

Referring to FIG. 16, a peripheral logic structure PS including a peripheral circuit PTR and a lower connection wiring body PW may be formed.

The horizontal conductive substrate USB may be formed on the peripheral logic structure PS.

Subsequently, a stacked structure ST including a plurality of electrode pads EP1, EP2, EP3, EP4, EP5, EP6, EP7 and EP8 may be formed on the horizontal conductive substrate USB. In addition, the first to third interlayer insulation films 142, 144 and 146 that cover the stacked structure ST may be formed.

The stacked structure ST may include an insulating mold part IMS in which inter-electrode insulation films ILD and the sacrificial mold insulation films ILD_SC are alternately stacked.

Figure 17:
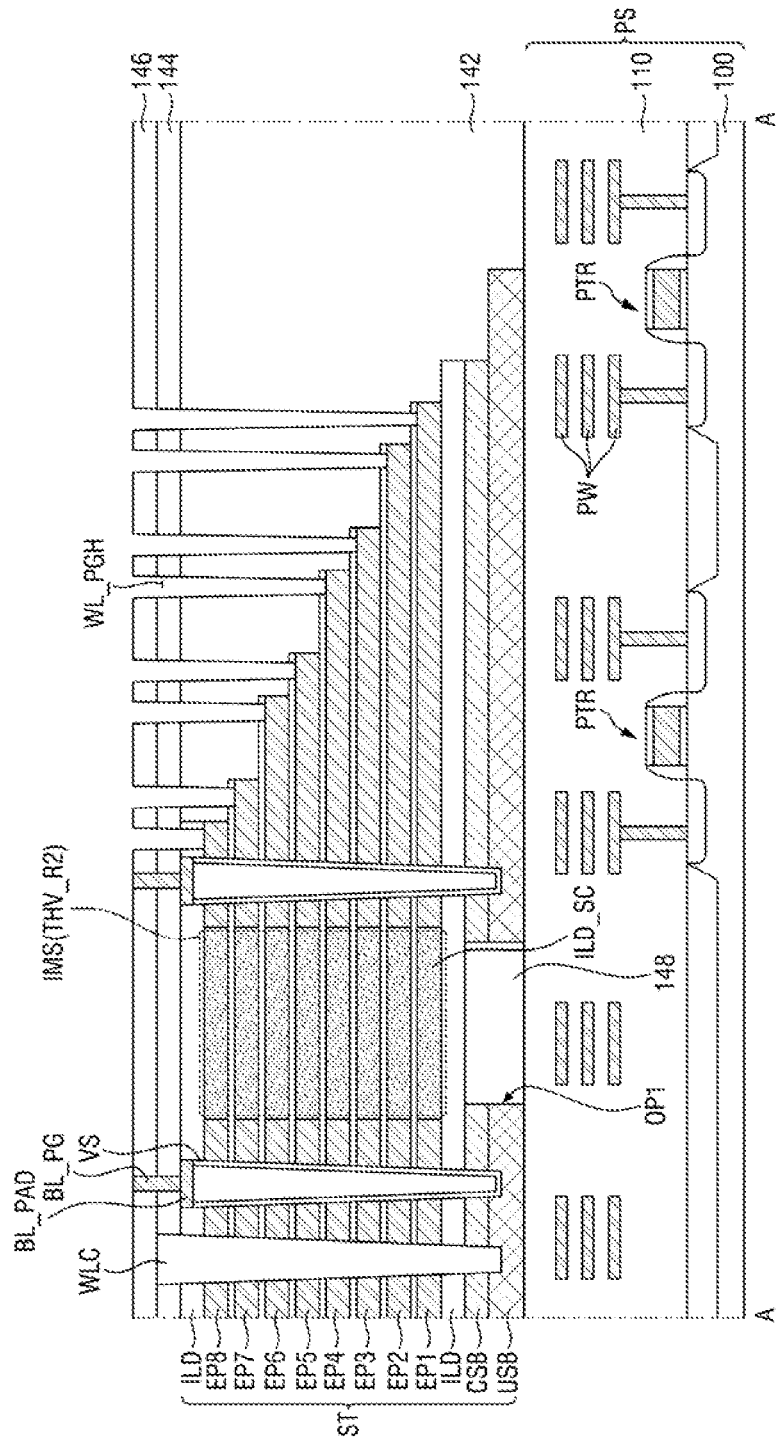

Referring also to FIG. 17, an electrode plug hole WL_PGH may be formed in the first to third interlayer insulation films 142, 144 and 146.

The electrode plug hole WL_PGH may expose some of the plurality of electrode pads EP1, EP2, EP3, EP4, EP5, EP6, EP7 and EP8.

Figure 18:
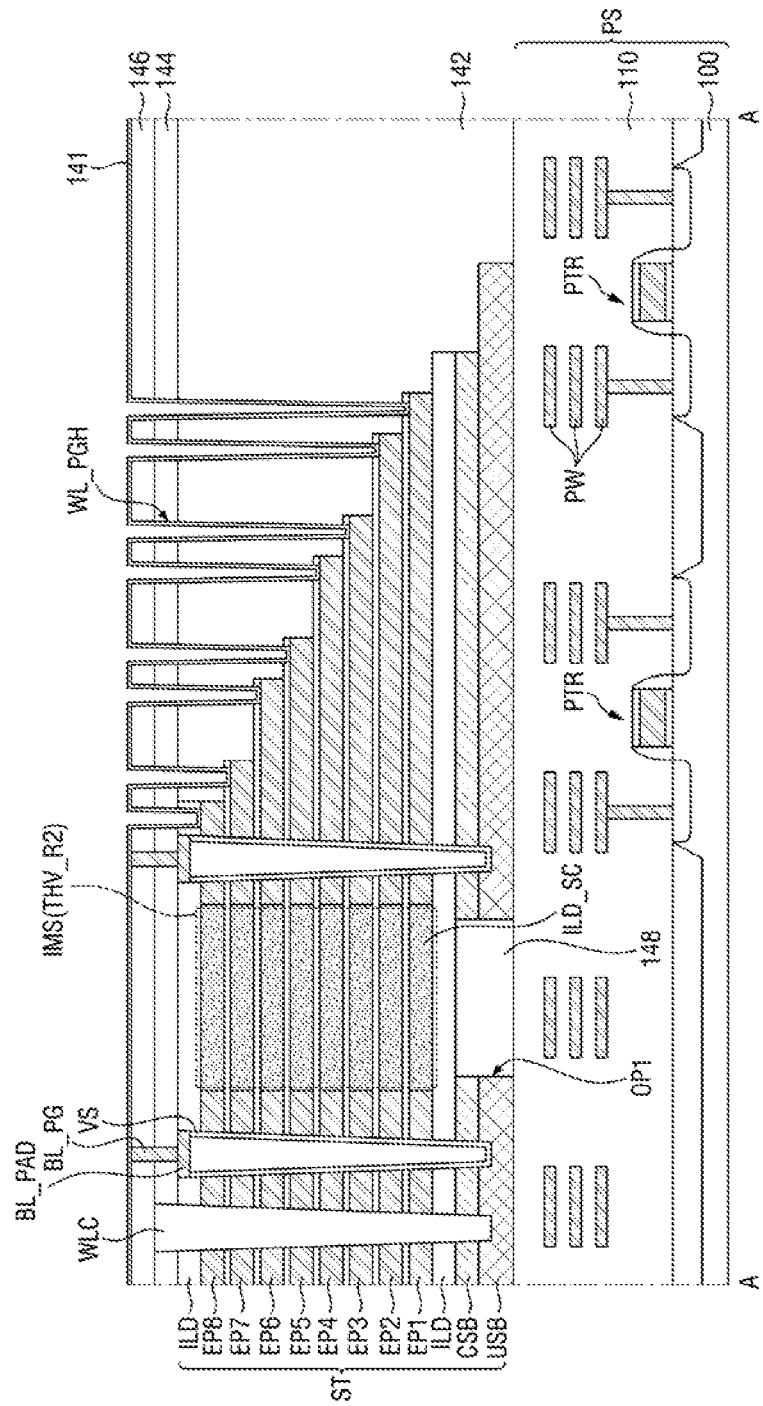

Referring to FIG. 18, an insulating liner film 141 may be formed along the upper surface of the third interlayer insulation film 146 and the profile of the electrode plug hole WL_PGH.

The insulating liner film 141 may be conformally formed. The insulating liner film 141 may include, e.g., silicon nitride.

Figure 19:
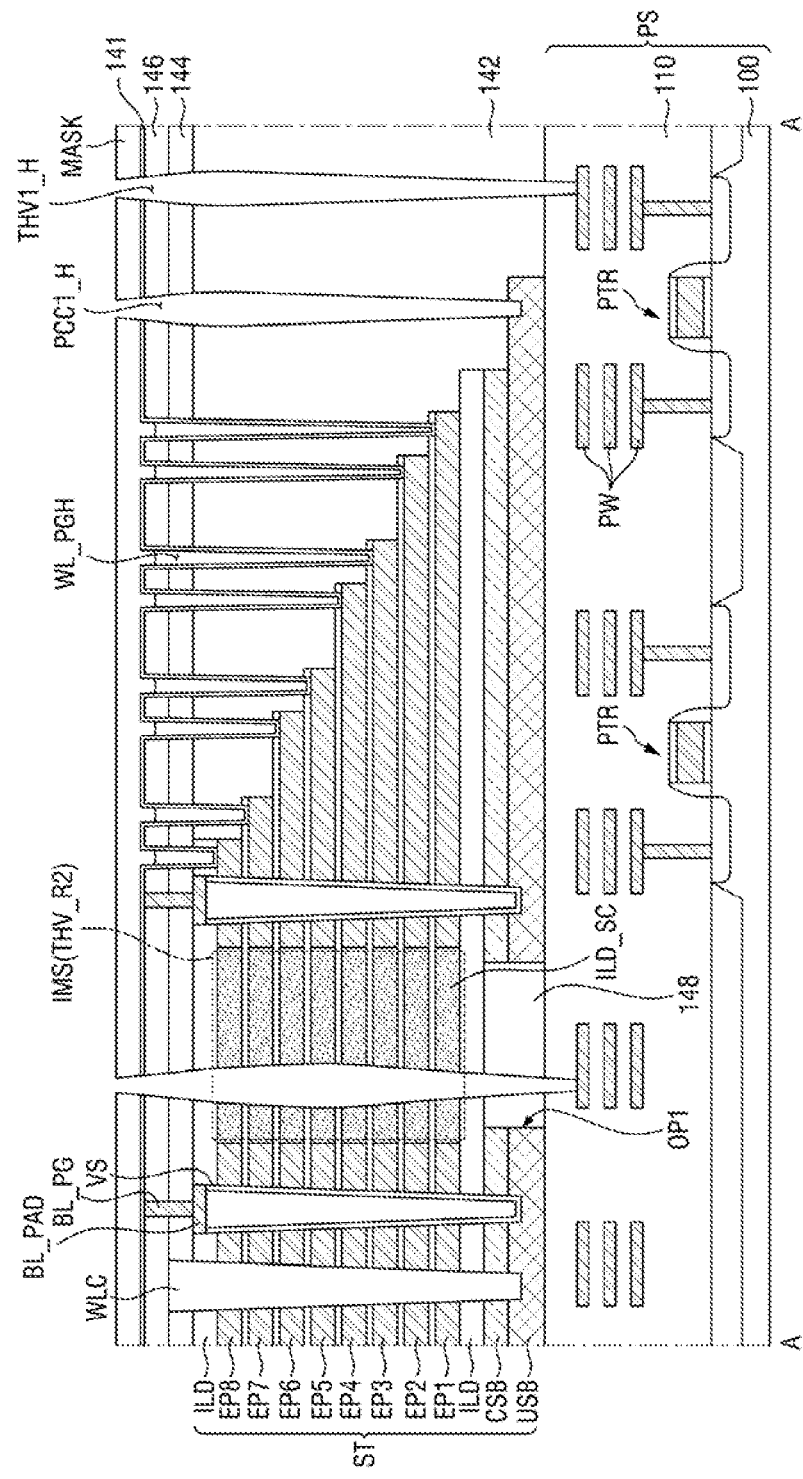

Referring to FIG. 19, a mask pattern MASK may be formed on the insulating liner film 141.

The mask pattern MASK may fill a part of the electrode plug hole WL_PGH.

The first plate contact hole PCC1_H, the first penetration electrode hole THV1_H, and the second penetration electrode hole THV2_H are simultaneously formed using the mask pattern MASK.

The first plate contact hole PCC1_H may be formed in the first to third interlayer insulation films 142, 144 and 146. The first plate contact hole PCC1_H exposes a part of the horizontal conductive substrate USB.

The first penetration electrode hole THV1_H may be formed in the first to third interlayer insulation films 142, 144 and 146 and the peripheral logic insulation film 110. The first penetration electrode hole THV1_H may expose a part of the lower connection wiring body PW.

The second penetration electrode hole THV2_H may be formed in the stacked structure ST. The second penetration electrode hole THV2_H may penetrate the insulating mold part IMS. The second penetration electrode hole THV2_H may expose a part of the lower connection wiring body PW.

Moving away from the upper surface of the third interlayer insulation film 146, the width of the first plate contact hole PCC1_H, the width of the first penetration electrode hole THV1_H and the width of the second penetration electrode hole THV2_H may increase and then decrease The plane on which the first penetration electrode hole THV1_H has the maximum width may be on the same vertical level as the plane at which the first plate contact hole PCC1_H has the maximum width, relative to the upper surface of the horizontal conductive substrate USB.

The plane at which the first penetration electrode hole THV1_H has the maximum width may be higher than the plane at which the second penetration electrode hole THV2_H has the maximum width, relative to the upper surface of the horizontal conductive substrate USB.

Next, the mask pattern MASK may be removed. Further, at least a part of the insulating liner film 141 formed along the profile of the electrode plug hole WL_PGH may be removed. In an implementation, the insulating liner film 141 formed on the bottom surface of the electrode plug hole WL_PGH may be removed.

Subsequently, referring to FIG. 5, a first plate contact plug PCC1, a first penetration electrode THV1, a second penetration electrode THV2 and electrode plugs WL_PG that fill the first plate contact hole PCC1_H, the first penetration electrode hole THV1_H, the second penetration electrode hole THV2_H and the electrode plug hole WL_PGH may be formed.

Figure 20:
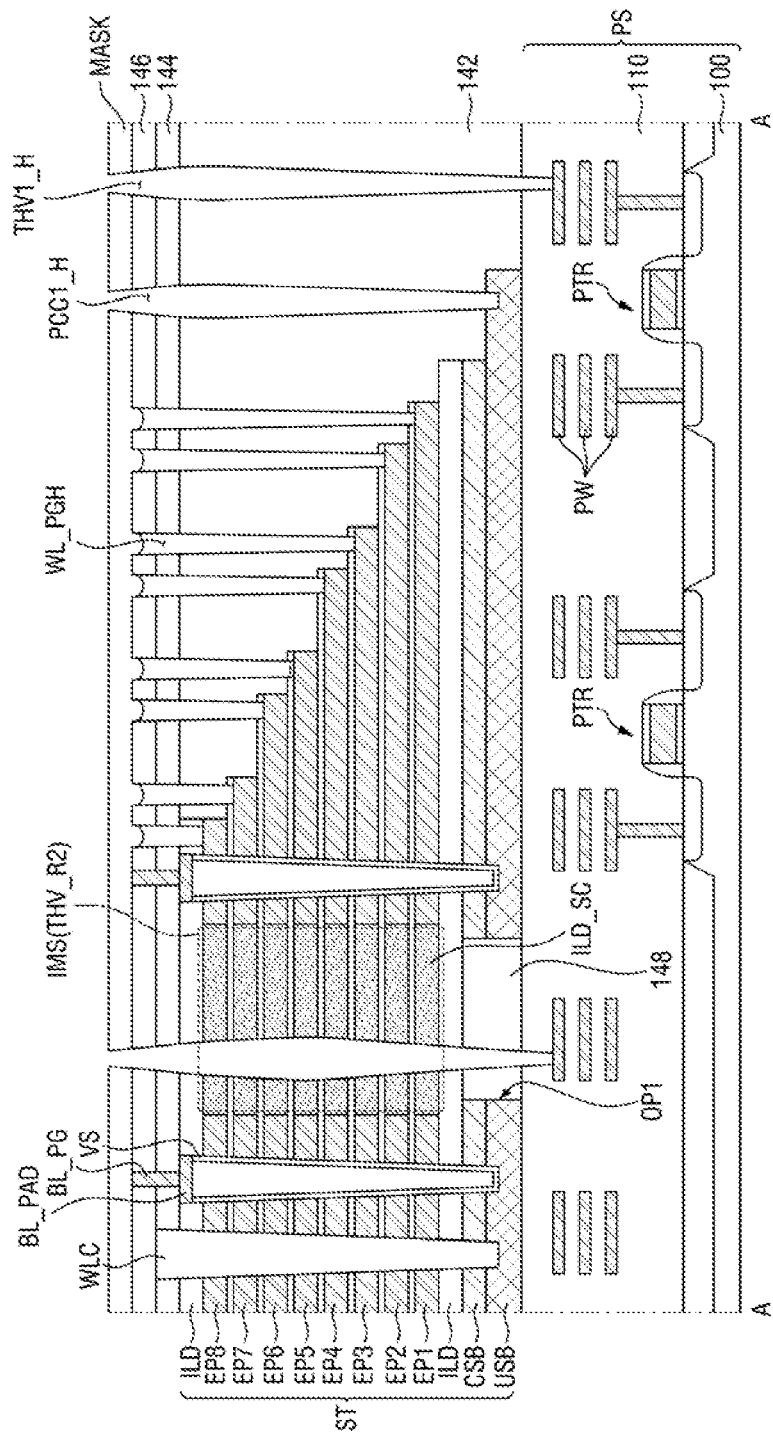
FIG. 20 is a cross-sectional view of a stage in the method of fabricating the semiconductor memory device according to some embodiments.

FIG. 20 is a cross sectional view of a stage in a method of fabricating a semiconductor memory device according to some embodiments. FIG. 20 may be a fabricating process performed after FIG. 17.

Referring to FIG. 20, a mask pattern MASK that fills a part of the electrode plug hole WL_PGH may be formed on the third interlayer insulation film 146.

Subsequently, the first plate contact hole PCC1_H, the first penetration electrode hole THV1_H, and the second penetration electrode hole THV2_H may be simultaneously formed, using the mask pattern MASK.

By way of summation and review, ultra-expensive equipment may be used for the miniaturization of the pattern, and the degree of integration of the two-dimensional semiconductor device is increasing, but may still be limited. Therefore, three-dimensional semiconductor memory devices (including memory cells arranged three-dimensionally) may be considered.

One or more embodiments may provide a three-dimensional semiconductor memory device that includes a vertical channel structure and has improved reliability and degree of integration.

One or more embodiments may provide a semiconductor memory device including a vertical channel structure with improved reliability and degree of integration.

One or more embodiments may provide a method of fabricating a semiconductor memory device including a vertical channel structure with improved reliability and degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a peripheral logic structure including a peripheral circuit and a lower connection wiring body on a substrate;
   a horizontal conductive substrate on the peripheral logic structure;
   a stacked structure including a plurality of electrode pads stacked in a vertical direction on the horizontal conductive substrate;
   a plate contact plug connected to the horizontal conductive substrate, extending in the vertical direction, and disposed in a first region extending in a first horizontal direction orthogonal to the vertical direction;
   a first penetration electrode connected to the lower connection wiring body, extending in the vertical direction, and disposed in a second region extending in the first horizontal direction, and
   a second penetration electrode penetrating the stacked structure, connected to the lower connection wiring body, and disposed in a third region extending in the vertical direction and a second horizontal direction perpendicular to the first horizontal direction and the vertical direction;
   wherein:
   an upper surface of the plate contact plug and an upper surface of the first penetration electrode are on a same plane,
   the plate contact plug includes an upper part and a lower part directly connected to each other,
   the first penetration electrode includes an upper part and a lower part directly connected to each other,
   moving away from the upper surface of the first penetration electrode in the vertical direction, a width of the upper part of the first penetration electrode increases, as measured in the second horizontal direction,
   moving away from the upper surface of the plate contact plug in the vertical direction, a width of the upper part of the plate contact plug increases, as measured in the second horizontal direction,
   moving away from the upper surface of the plate contact plug in the vertical direction, a width of the lower part of the plate contact plug decreases, as measured in the second horizontal direction, and
   moving away from the upper surface of the first penetration electrode, a width of the lower part of the first penetration electrode decreases, as measured in the second horizontal direction.

2. The semiconductor memory device as claimed in claim 1, wherein:
   the plate contact plug has a maximum width at a first boundary between the upper part of the plate contact plug and the lower part of the plate contact plug, the maximum width being a widest portion of the plate contact plug and being greater than a minimum width of another portion of the plate contact plug,
   the first penetration electrode has a maximum width at a second boundary between the upper part of the first penetration electrode and the lower part of the first penetration electrode, the maximum width being a widest portion of the first penetration electrode and being greater than a minimum width of another portion of the first penetration electrode; and
   the first boundary and the second boundary are at a same vertical level relative to the plane of the upper surface of the first penetration electrode and the upper surface of the plate contact plug.

3. The semiconductor memory device as claimed in claim 2, wherein:
   at least a part of side walls of the plate contact plug have a convex curved surface,
   at least a part of side walls of the first penetration electrode have a convex curved surface,
   the first boundary is at a portion in which the plate contact plug has a convex curved surface, and
   the second boundary is at a portion in which the first penetration electrode has a convex curved surface.

4. The semiconductor memory device as claimed in claim 1, further comprising a plurality of electrode plugs connected to the plurality of electrode pads,
wherein upper surfaces of the plurality of electrode plugs are on the same plane as the upper surface of the plate contact plug.

5. The semiconductor memory device as claimed in claim 4, wherein the first penetration electrode, the plate contact plug, and the electrode plug have a same conductive film stacked structure.

6. The semiconductor memory device as claimed in claim 1, further comprising:
a plurality of electrode plugs connected to the plurality of electrode pads; and
an insulating plug liner extending along side walls of each of the plurality of electrode plugs.

7. The semiconductor memory device as claimed in claim 1, wherein:
the horizontal conductive substrate includes:
a fourth region that overlaps the stacked structure, and
a fifth region that does not overlap the stacked structure, and
the plate contact plug is connected to the fifth region of the horizontal conductive substrate.

8. The semiconductor memory device as claimed in claim 7, wherein the plate contact plug and the first penetration electrode do not penetrate the stacked structure.

9. The semiconductor memory device as claimed in claim 7, wherein the plate contact plug and the first penetration electrode penetrate the stacked structure.

10. The semiconductor memory device as claimed in claim 1, further comprising a metallic plate film extending along a lower surface of the horizontal conductive substrate, the metallic plate film being between the lower connection wiring body and the horizontal conductive substrate.

11. The semiconductor memory device as claimed in claim 1, wherein:
the horizontal conductive substrate includes a semiconductor material, and
the semiconductor material includes a n-type impurity, a p-type impurity, or carbon.

12. The semiconductor memory device as claimed in claim 1, wherein:
the second penetration electrode includes an upper part and a lower part directly connected to each other, and
moving away from the upper surface of the second penetration electrode in the vertical direction, the width of the upper part of the second penetration electrode increases and the width of the lower part of the second penetration electrode decreases, as measured in the second horizontal direction.

13. The semiconductor memory device as claimed in claim 12, wherein:
the first penetration electrode does not penetrate the stacked structure, and
a plane at which the first penetration electrode has a maximum width is higher than a plane at which the second penetration electrode has a maximum width, relative to the upper surface of the horizontal conductive substrate in the vertical direction, wherein the maximum width of the second penetration electrode is a widest portion of the second penetration electrode and greater than a minimum width of another portion of the second penetration electrode.

14. A semiconductor memory device, comprising:
a peripheral logic structure including a peripheral circuit and a lower connection wiring body on a substrate;
a horizontal conductive substrate on the peripheral logic structure;
a stacked structure including a plurality of electrode pads stacked in a vertical direction on the horizontal conductive substrate;
a first plate contact plug connected to the horizontal conductive substrate, extending in the vertical direction, and disposed in a first region extending in a first horizontal direction orthogonal to the vertical direction;
a first penetration electrode connected to the lower connection wiring body, extending in the vertical direction, and disposed in a second region extending in the first horizontal direction; and
a second penetration electrode penetrating the stacked structure, connected to the lower connection wiring body, and disposed in a third region extending in the vertical direction and a second horizontal direction perpendicular to the first horizontal direction and the vertical direction,
wherein:
the first penetration electrode and the first plate contact plug do not penetrate the stacked structure,
an upper surface of the first plate contact plug, an upper surface of the first penetration electrode, and an upper surface of the second penetration electrode are on a same plane,
a plane at which the first penetration electrode has a maximum width is higher than a plane at which the second penetration electrode has a maximum width, relative to the upper surface of the horizontal conductive substrate in the vertical direction, wherein the maximum widths of the first and second penetration electrodes are respectively a widest portion of the first and second penetration electrodes and are greater than a minimum width of another portion of the first and second penetration electrodes, and
the plane at which the first penetration electrode has a maximum width is at a same vertical level as the plane at which the first plate contact plug has a maximum width, relative to the upper surface of the horizontal conductive substrate in the vertical direction, wherein the maximum width is a widest portion of the first plate contact plug and is greater than a minimum width of another portion of the first plate contact plug.

15. The semiconductor memory device as claimed in claim 14, wherein:
moving away from the upper surface of the first penetration electrode in the vertical direction, the width of the first penetration electrode increases and then decreases, as measured in the second horizontal direction,
moving away from the upper surface of the second penetration electrode in the vertical direction, the width of the second penetration electrode increases and then decreases, as measured in the second horizontal direction, and
moving away from the upper surface of the first plate contact plug in the vertical direction, the width of the first plate contact plug increases and then decreases, as measured in the second horizontal direction.

16. The semiconductor memory device as claimed in claim 14, wherein:
at least a part of side walls of the first penetration electrode have a convex curved surface,
at least a part of side walls of the second penetration electrode have a convex curved surface, and
at least a part of side walls of the first plate contact plug have a convex curved surface.

17. The semiconductor memory device as claimed in claim 14, further comprising a second plate contact plug penetrating the stacked structure and being connected to the horizontal conductive substrate, wherein an upper surface of the second plate contact plug is on the same plane as the upper surface of the second penetration electrode.

18. The semiconductor memory device as claimed in claim 17, wherein the plane at which the second penetration electrode has a maximum width is at a same vertical level as the plane at which the second plate contact plug has a maximum width, relative to the upper surface of the horizontal conductive substrate in the vertical direction.

19. The semiconductor memory device as claimed in claim 14, further comprising a metallic plate film in contact with the horizontal conductive substrate, the metallic plate film being between the lower connection wiring body and the horizontal conductive substrate.

20. A semiconductor memory device, comprising:
- a peripheral logic structure including a peripheral circuit and a lower connection wiring body on a substrate;
- a horizontal conductive substrate extending along an upper surface of the peripheral logic structure;
- a stacked structure including a plurality of electrode pads stacked in a vertical direction on the horizontal conductive substrate;
- a plurality of vertical structures penetrating the stacked structure and electrically connected to the horizontal conductive substrate;
- a vertical structure support film between the stacked structure and the horizontal conductive substrate and being in contact with the vertical structures;
- a plurality of electrode plugs connected to the plurality of electrode pads;
- a plate contact plug connected to the horizontal conductive substrate, extending in the vertical direction, and disposed in a first region extending in a first horizontal direction orthogonal to the vertical direction;
- a first penetration electrode connected to the lower connection wiring body, extending in the vertical direction, and disposed in a second region extending in the first horizontal direction, and
- a second penetration electrode penetrating the stacked structure, connected to the lower connection wiring body, and disposed in a third region extending in the vertical direction and a second horizontal direction perpendicular to the first horizontal direction and the vertical direction, wherein:

an upper surface of the plate contact plug and an upper surface of the first penetration electrode are on a same plane, a height in the vertical direction from a plane at which the plate contact plug has a maximum width, the maximum width being a widest portion of the plate contact plug and being greater than a minimum width of another portion of the plate contact plug, to the upper surface of the plate contact plug is a first height, a height in the vertical direction from a plane at which the first penetration electrode has a maximum width, the maximum width being a widest portion of the first penetration electrode and being greater than a minimum width of another portion of the first penetration electrode, to the upper surface of the first penetration electrode is a second height, a height in the vertical direction of the first penetration electrode is H, the first height and the second height are each greater than 0, and a difference between the first height and the second height is greater than or equal to 0, and is smaller than or equal to 0.0015*H.

* * * * *